United States Patent
Haun

(10) Patent No.: US 10,540,189 B2
(45) Date of Patent: Jan. 21, 2020

(54) FORMALIZED EXECUTION OF MODEL INTEGRATED DESCRIPTIVE ARCHITECTURE LANGUAGES

(71) Applicant: Analytical Graphics Inc., Exton, PA (US)

(72) Inventor: Gregory Alan Haun, Exton, PA (US)

(73) Assignee: Analytical Graphics Inc., Exton, PA (US)

( * ) Notice: Subject to any disclaimer, the term of this patent is extended or adjusted under 35 U.S.C. 154(b) by 0 days.

(21) Appl. No.: 15/986,630

(22) Filed: May 22, 2018

(65) Prior Publication Data
US 2019/0129724 A1 May 2, 2019

Related U.S. Application Data

(60) Provisional application No. 62/509,466, filed on May 22, 2017.

(51) Int. Cl.

| | | |
|---|---|---|
| G09B 7/00 | (2006.01) | |
| G09B 7/04 | (2006.01) | |
| G06F 17/30 | (2006.01) | |
| G06F 9/44 | (2018.01) | |
| G06F 9/448 | (2018.01) | |
| G06F 17/50 | (2006.01) | |

(Continued)

(52) U.S. Cl.
CPC .............. *G06F 9/448* (2018.02); *G06F 8/10* (2013.01); *G06F 8/34* (2013.01); *G06F 8/41* (2013.01); *G06F 17/5009* (2013.01)

(58) Field of Classification Search
CPC .. G06F 17/5009; G06F 16/244; G06F 16/248; G06F 16/254; G06F 19/00; G06F 9/448; G06F 8/10; G06F 8/41; G06F 17/5045; G06F 2217/04; G06F 2217/68; G06F 16/1834; G06F 3/067; G06F 8/34; G09B 23/28; G09B 7/04; G16H 50/50; H04L 67/104; H04L 67/1097

See application file for complete search history.

(56) References Cited

U.S. PATENT DOCUMENTS 8,719,199 B2 * 5/2014 Izhikevich ............... G06N 3/10
706/23
9,357,331 B2 * 5/2016 Huang .................... H04W 4/60
(Continued)

OTHER PUBLICATIONS

Hu et al., DCNSim: a unified and cross-layer computer architecture simulation framework for data center network research, 9 pages (Year: 2013).*

(Continued)

*Primary Examiner* — Thuy Dao
(74) *Attorney, Agent, or Firm* — The Marbury Law Group, PLLC

(57) ABSTRACT

Systems, methods, devices, and non-transitory media of the various embodiments may enable formalized execution of model integrated descriptive architecture languages, such as Unified Modeling Language (UML). In addition, the systems, methods, devices, and non-transitory media of the various embodiments may be used to generate a graphical representation of a simulation. In an embodiment, a Unifying Framework for Orchestration and Simulation (UFOS) environment may be implemented to generate an agent behavior model using abstract objects from an ontological model.

17 Claims, 29 Drawing Sheets

(51) Int. Cl.
    *G06F 8/41*    (2018.01)
    *G06F 8/10*    (2018.01)
    *G06F 8/34*    (2018.01)

(56) References Cited

U.S. PATENT DOCUMENTS

| | | | | |
|---|---|---|---|---|
| 9,412,064 | B2* | 8/2016 | Szatmary | G06N 3/049 |
| 9,449,019 | B2* | 9/2016 | Lacapra | H04L 67/104 |
| 9,460,387 | B2* | 10/2016 | Sinyavskiy | G06N 3/049 |
| 9,514,254 | B2* | 12/2016 | Winfrey | G06F 17/5009 |
| 2002/0069039 | A1* | 6/2002 | Ricks | G06F 17/5009 |
| | | | | 703/1 |
| 2004/0154003 | A1* | 8/2004 | Oi | G06F 8/35 |
| | | | | 717/135 |

OTHER PUBLICATIONS

Hubscher-Younger et al., Integrating discrete-event and time-based models with optimization for resource allocation, 15 pages (Year: 2012).*

* cited by examiner

```java
public StkValue rangeTo(StkEntity endObject) {
    StkValue rangeResult = null;
    try {
        if (this.stkObj.isVgtSupported() && endObject.stkObj.isVgtSupported()) {
            IAgCrdnProvider fromProvider = this.stkObj.getVgt();
            IAgCrdnProvider endProvider = endObject.stkObj.getVgt();
            IAgCrdnPoint fromLoc = this.stkObj.getVgt().getPoints().getItem("Center");
            IAgCrdnPoint endLoc = endObject.stkObj.getVgt().getPoints().getItem("Center");
            IAgCrdnVectorGroup vectorList = fromProvider.getVectors();
            IAgCrdnVectorFactory vectorFactory = vectorList.getFactory();
            String vectorName = "DVector_"+vectorList.getCount();
            vectorFactory.createDisplacementVector(vectorName, fromLoc, endLoc);
            AgCrdnVectorDisplacementClass resultingVector = (AgCrdnVectorDisplacementClass)
                vectorList.getItem(vectorName);
            IAgCrdnCalcScalarGroup calc = fromProvider.getCalcScalars();
            IAgCrdnCalcScalarFactory calcFactory = calc.getFactory();
            String distanceName = "shuttle_distance_"+vectorList.getCount();
            AgCrdnCalcScalarVectorMagnitudeClass measure = (AgCrdnCalcScalarVectorMagnitudeClass)
                calcFactory.createCalcScalarVectorMagnitude(distanceName, "shuttle distance");
            measure.setInputVector(resultingVector);
            rangeResult = new StkValue(measure, fromProvider);
        }
    } catch (AgCoreException e) {
        e.printStackTrace();
    }
    return rangeResult;
}
```

FIG. 4

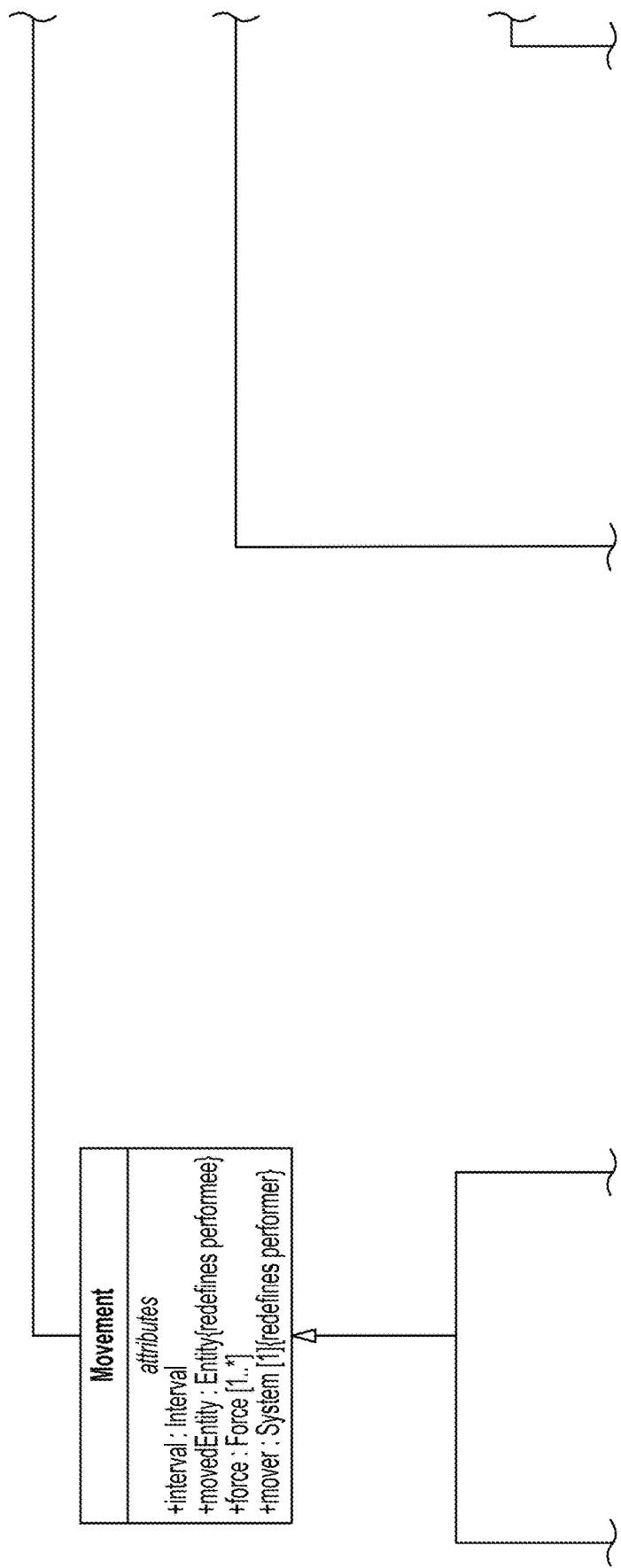

FORMALIZED EXECUTION OF MODEL INTEGRATED DESCRIPTIVE ARCHITECTURE LANGUAGES

CROSS-REFERENCE TO RELATED APPLICATIONS

This application claims the benefit of priority to U.S. Provisional Application No. 62/509,466 filed May 22, 2017, entitled "Formalized Execution of Model Integrated Descriptive Architecture Languages," the entire contents of which are hereby incorporated by reference.

FIELD

The present invention relates generally to modeling and/or simulation systems and more particularly to a modeling and/or simulation system that includes a modular framework for dynamically changing agent behaviors.

BACKGROUND

Simulations may be used to predict and/or understand the effects created by actions or interactions within various environments. For example, agent-based models may be used to simulate human or other object behavior in a wide variety of settings and domains such as land, sea, air, space, and cyber. Typically, in order to execute each simulation, a set of agents may be created such that a set of characteristics and/or attributes are assigned to each of the created agents.

However, for each interaction, the characteristics and attributes of the agents corresponding to an object and/or an agent corresponding to the environment must be individually identified and coded prior to orchestration and execution of the simulation. In addition, analysis and execution of a simulation are typically performed concurrently such that analysis results may be unavailable until the conclusion of the execution of the simulation.

SUMMARY

The systems, methods, devices, and non-transitory media of the various embodiments may enable formalized execution of model integrated descriptive architecture languages, such as Unified Modeling Language (UML).

In addition, the systems, methods, devices, and non-transitory media of the various embodiments may be used to generate a graphical representation of a simulation. In an embodiment, a Unifying Framework for Orchestration and Simulation (UFOS) environment may be implemented to generate an agent behavior model using abstract objects from an ontological model.

Various embodiments may provide a method performed by a processor of a computing device that includes receiving a simulation query including an agent identifier associated with an agent to be included in a simulation, determining whether the simulation query includes an operation statement, requesting an agent behavior model based on the agent identifier in response to determining that the simulation query includes an operation statement, receiving the requested agent behavior model from a UFOS environment, wherein the requested agent behavior model includes an agent information placeholder, retrieving an agent model of the agent to be included in the simulation, updating the agent behavior model to replace the agent information placeholder with information included in the agent model, compiling the agent behavior model and the agent model to generate simulation executable code, and generating a graphical representation of the simulation executable code to display on a display of the computing device.

Further embodiments include a computing device having a processor configured with processor-executable instructions to perform operations of the methods summarized above. Further embodiments include a computing device including means for performing functions of the methods summarized above. Further embodiments include a non-transitory processor-readable storage medium having stored thereon processor-executable instructions configured to cause a computing device processor to perform operations of the methods summarized above.

BRIEF DESCRIPTION OF THE DRAWINGS

FIG. 4 is an example schema of a specific software delegate implementing the 'rangeTo' operation according to various embodiments.

DETAILED DESCRIPTION

Figure 1:
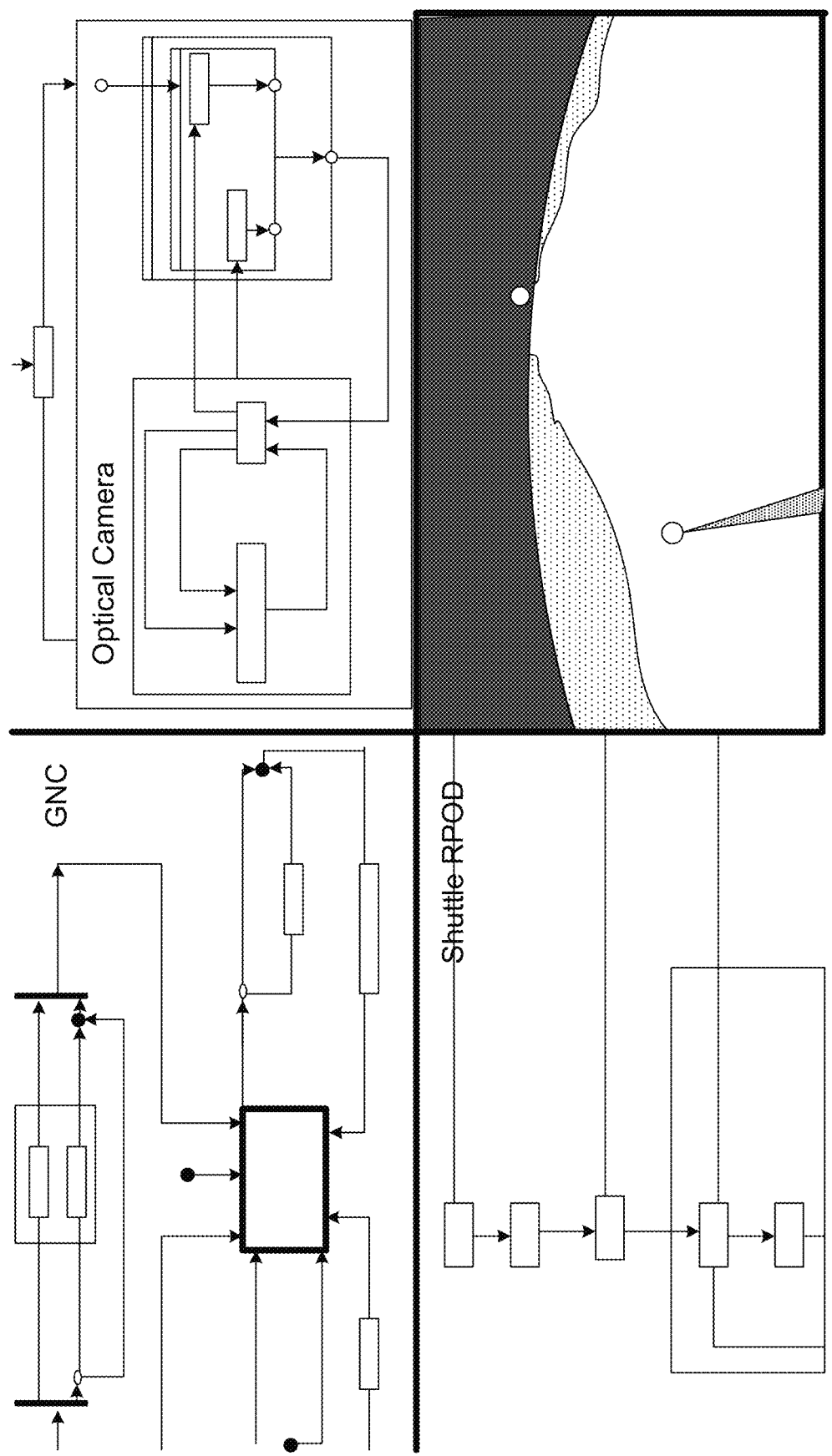
FIG. 1 illustrates an example physics-constrained multi-agent simulation playout according to various embodiments.

The various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the invention or the claims.

Modeling and simulation of integrated cross-domain (land, sea, air, space, and cyber, etc.) interactions may be a critical element in predicting the systems-of-systems performance and understanding possible induced effects when presented with various environmental and threatening conditions within the desired mission context.

Agent-based models may be used to represent the complex network of interacting systems. An agent-based simulation may allow analysts to describe and vary the behavior of the agents, which are typically represented through scripting languages or code-defined dependency trees, which incorporate embedded system parameters and concept of operations (CONOPS) representations in order to generate a realistic mission profile when played out.

While this approach alone may allow for single executions of very specific behavior-based systems, it may lack the flexibility and robustness necessary to manipulate these behaviors without becoming cost prohibitive and time-constrained in the attempt to effectively explore the trade space. Agent-based models may face challenges including that subject matter experts in the various fields must describe these behaviors in sufficient fashion and detail through extensive interaction, such that developers can capture these behaviors in a form capable of machine simulation. This approach exposes the risk of behaviors and/or CONOPS described incorrectly due to the semantic and logical misinterpretations that can occur during the transfer of such information, thus cost and time can become significant in order to mitigate such concerns. Additionally, current agent-based simulation tools and methods have not focused on the scalable incorporation of best-of breed tools and physics capabilities to support the integrated play-out of these agents within realistic physics environments.

Future analysis will require greater breadth and depth of physics modeling for describing integrated systems, which will require reusable orchestration of tools, models, and data with respect to integration and relevance in order to analyze the agent-based behaviors of future capabilities operating across a complex command and control (C2) network of integrated systems.

The systems, methods, devices, and non-transitory media of the various embodiments may enable formalized execution of model integrated descriptive architecture languages, such as Unified Modeling Language (UML). Various embodiments may provide a Model Execution Dialect for Unified Semantic Analysis (MEDUSA) environment that may provide an open, standardized orchestration capability for creation, model integration, and formalized interpretation of user-defined ontological descriptions which can be executed and analyzed in support of CONOPS development, course-of-action (COA), sensitivity discovery, and 'What-if' analysis. The various embodiments may provide for reusable, reconfigurable, and scalable integration of multiple simulations, models, algorithms, and data composed through parametric definitions, orchestration architectures, and defining governance and assumptions within a common and synchronized environment for trade space analysis, simulated mission play-out, and/or COA discovery and assessment.

Well-structured and actionable knowledge may be essential when formulating options and alternatives with regard to complex interactions and processes while intending to arrive at the most effective and efficient decision in a timely manner. By organizing information structures with regard to hierarchical inheritance and associative relationships, the various embodiments may enable the presence of relational data to become semantically grounded and formally described with regard to other data types. Such ontological models in the various embodiments may allow for machine-assisted reasoning and formalized concept development without being bound to the human errors of intrinsic decision and design familiarity. The embodiment MEDUSA environment may host a foundational ontological information model for describing complex, multi-domain problems and concepts, while providing a semantic and architectural formalism facilitating the reliable orchestration and execution of models and data. This well-structured and actionable knowledge may enable formulating the agent models for simulation with regard to complex interactions and behavioral processes. This ultimately may provide the domain specific language and semantically formalized taxonomy for describing these agent interactions. In various embodiments, these agents may be represented in graphical form, allowing for visual vetting of the structural dependencies and the behavioral logic. Due to the expansive knowledge that can be captured within the ontological information model, various embodiment agents for interaction and exploration may be constructed to model doctrine and policy, missions and their tactics, systems and their CONOPS, and the subsystems with their underlying software logic.

The embodiment MEDUSA environment may work in concert with an Agent Modeling of Event-Based Architectures (AMoEBA) simulation framework, facilitating the direct interpretation and execution of concept architectures, doctrinal/policy motivations, systemic modes of operation, and human methods described using UML and ontologically orchestrated tool extensions. These complex agent interactions of the various embodiments, constructed through semantically formalized behaviors and physics constrained events, may allow for non-developers and experts in the field to easily and graphically capture, vet, execute, and adapt these models for analysis and simulation needs without being hindered by additional development translation and explanation efforts. Architecture representations with performance limitations orchestrated through adapter-linked physics tooling and behaviors crafted graphically as state machine and activity diagrams utilizing the inherent semantic formalism provided by the various embodiments may be easily explored with respect to parametric sensitivity discovery, system/concept mission utility, and course-of-action/what-if analysis. These architectural representations may fulfill both documentation requirements, while also serving as the very model for simulation playout and analysis discovery. For example, FIG. 1 illustrates an example physics-constrained multi-agent simulation playout according to various embodiments.

Various embodiments may enable the integrated playout of the architectural models with physics tooling allowing for complex intra and inter-agent interactions, capable of exposing areas for optimization and/or exploitation. The above-described modeling and simulation construct of the various embodiments may allow for direct manipulation of agent performance and behavior without compiling additional agent-specific code changes for execution. In various embodiments, using the existing ontological knowledge language, the user may create new logic pathways and simply describe new transition criteria directly on the state machines or activity diagrams, and execute again. The execution may be direct through the interpretation, execution, and evaluation of knowledge statements and the graphical logic relationships. For example, various embodiments may enable the interpretation, execution, and evaluation of knowledge statements and the graphical logic relationships using AGI's Modeling Simulation and Analysis Framework (MSAF) with an embodiment MEDUSA Environment and embodiment AMoEBA Framework.

An embodiment MEDUSA environment may utilize the industry-standard UML as the basis for the ontological knowledge capture and model description through the provision of structural and behavioral mechanisms for capture of the doctrine, concepts, systems, and operational methods of interest. UML is a general-purpose, developmental, modeling language typically used in the field of software engineering to provide a standard way to visualize the design of a system. In various embodiments MEDUSA may provide an innovative approach in capturing ontological information with UML, specifically serving as an ontological information model for the purposes of formalized composition and semantic-based knowledge discovery, as well as framework-directed execution and machine learning.

An information model in software engineering may be a representation of concepts and the relationships, constraints, rules, and operations to specify data semantics for a chosen domain of discourse. Typically, it specifies relations between kinds of things, but may also include relations with individual things. In computer science and information science, an ontology may be a classification or formal naming and definition of the types, properties, and interrelationships of the entities that rely or fundamentally exist for a particular domain of discourse. In various embodiments, MEDUSA may enable the user-defined development of a common vernacular for describing things; such as concepts, activities, and objects; from the abstract to the specialized with inheritance and association. Instead of using a proprietary, previously formulated language, the user of such an embodiment environment may be able to describe things from his/her perspective, supporting collaboration and enterprise knowledge capture. This becomes a hierarchical, dimensional, dependent arrangement of meta-models describing broad phenomena, concepts, functions, relationships, and interactions in the abstract, thus providing formalism to a problem space without constraining to the specific model, tool, or data provider.

In various embodiments, an ontological information model when defined in UML with mapped model delegates may be provided. Such an embodiment ontological information model when defined in UML with mapped model delegates may provide a standardized execution language and formalized means for information discovery/capture.

In various embodiments, the ontological information layer may provide semantic standardization for concrete integration through a formalized well-typed abstraction of concepts and their relations, constraints, rules, and operations, thereby clarify taxonomy and ontological relationships. In various embodiments, the ontological information layer may normalize disparate implementations characterized by differing approaches and defining assumptions designed to arrive at the same result, thereby mitigating a perceived lack of interoperability without the introduction of significant and repetitive data governance and subject matter expert (SME) involvement. In various embodiments, the ontological information layer may capture the physics phenomena, domain concepts, systemic functions, and process interactions in the abstract, while creating a single order against which all data models can be mapped, thereby clarifying areas of assumption within the tools during mapping and capturing 'Interface Control' and 'Algorithm Description' aspects. In various embodiments, the ontological information layer may become a foundation for integration and the expansion to automated code generation. In various embodiments, the ontological information layer may allow for machine-assisted reasoning and formalized concept development without being bound to the human errors of intrinsic decision and design familiarity.

Figure 2:
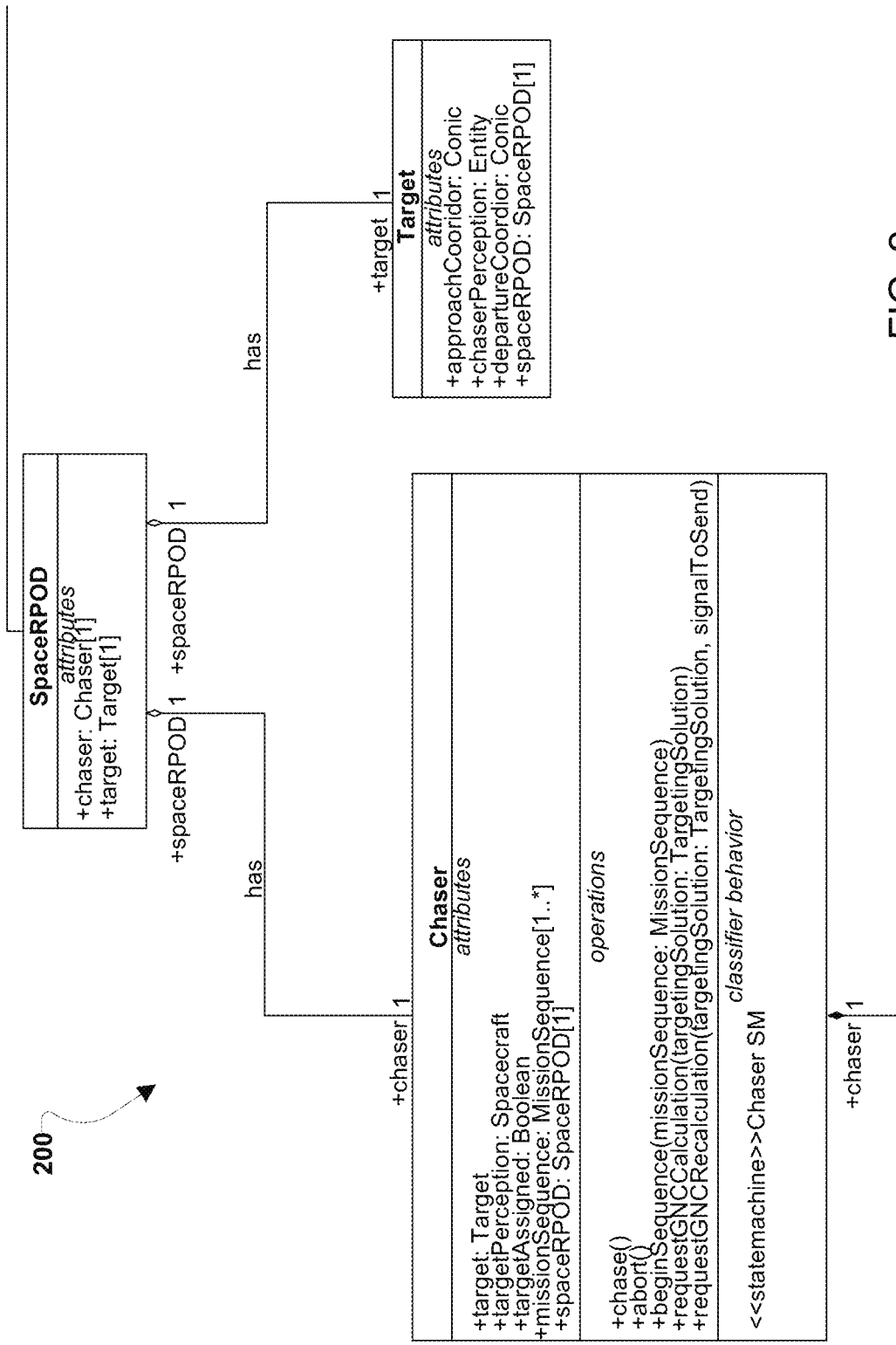
FIG. 2 illustrates a close up view of a portion of an ontological information model in UML according to various embodiments.

In various embodiments, the MEDUSA environment may provide the mechanism for capture of the ontological information layer, the formalized integration of models/tools/data, as well as the engine for semantic interpretation and machine reasoning during direct execution. In various embodiments, the MEDUSA environment may ensure that well-formalized, semantic information is capable of being utilized as the natural language for describing machine interpretable and executable relationships. In various embodiments, the MEDUSA environment may discover type-formalized instance relationships, dependencies, and inferences through hierarchical and associative relationships. In various embodiments, the MEDUSA environment may interpret ontological expressions during runtime facilitating tool delegate execution. FIG. 2 illustrates a close up view of a portion 200 of an ontological information model in UML according to various embodiments.

FIG. 2 illustrates a portion 200 of an ontological information model that may include a depiction of a Space Rendezvous, Proximity Operations, and Docking Concept with associations representing properties for the objects and methods describing capabilities acting on or requiring other objects according to various embodiments. These things with the properties and methods become the constituents of a formal language/taxonomy useful for describing a problem or concept for further simulation, discovery, and sensitivity analysis.

In various embodiments, this language may be presented graphically with an underlying meta-model facilitating consistent interpretation and automated execution/code generation. The structural elements may provide the ability to capture performance and property-based information, while the behavioral elements allow for the representation of state machine and activity flows balanced by use-case descriptors. The embodiment ontological information model allows for agent relationships and activities to be described, thus providing an inherent taxonomy for the formalized description and execution of composite behaviors without being burdened with the semantic confusion and ambiguity often found when trying to analyze and coordinate complex processes and interactions.

As described above, the ontological information model may provide for describing a domain interest as well as a semantically formalized methodology for integration. The integration of external tools/models/data may provide code implementations/extensions to the base classifier properties and methods described within the information model. These delegates may be modularized, formally addressable elements, which can be utilized during orchestrated execution.

Figure 3:
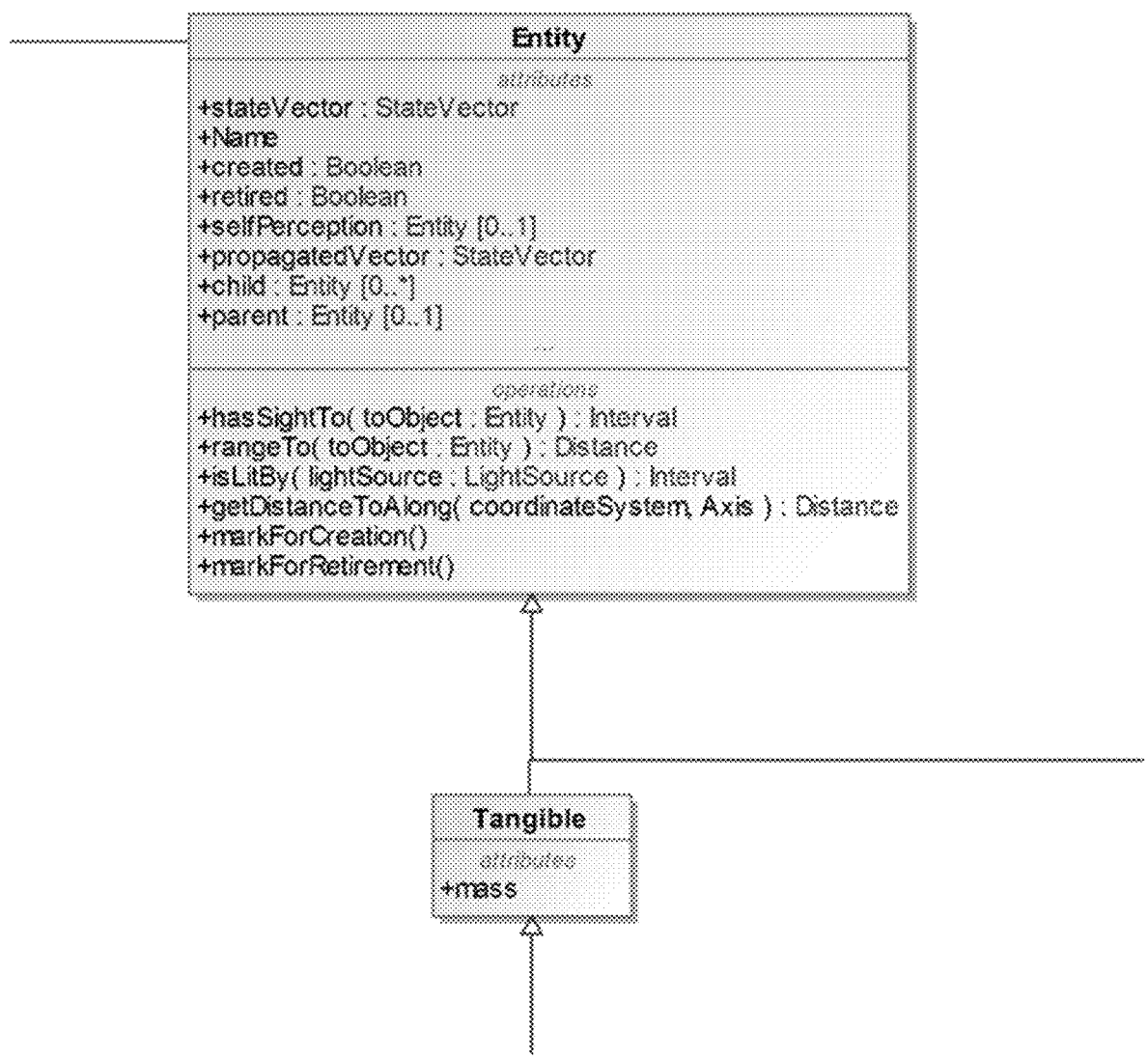
FIG. 3 illustrates an example of the 'Entity' type object, which inherits from the abstract 'Thing' and has specializations of 'Tangible' and 'SpatialGeometric', and so on according to an embodiment.

FIG. 3 illustrates an example of the 'Entity' type object, which inherits from the abstract 'Thing' and has specializations of 'Tangible' and 'SpatialGeometric', and so on according to an embodiment.

FIG. 4 is an example schema of a specific software delegate implementing the 'rangeTo' operation according to various embodiments. Specifically, FIG. 4 shows an example STK 'Entity.rangeTo(toObject:Entity)' operation Calculation Delegate. Given that the types are well defined in the schema, the environment knows that the 'Entity' type can only pose this question to another 'Entity' typed object. This provides a modular formalism utilized during orchestration and execution.

In various embodiments, a MEDUSA environment may use the Java Expression Language (JEXL) libraries to construct an expression language interpreter for these user-defined domain dialects, supporting UML evaluations, such as constraints, transitions, etc. This may be fundamentally unique to other constraint languages, in that the interpreter is separate and not bound to a predefined language definition, allowing for dynamically constructed taxonomies built within UML with formally typed relationships. This allows for dynamic machine evaluation and execution, as well as formal semantic analysis, pattern recognition, and pattern discovery/capture.

As an example of various embodiment operations, if there was an interest in knowing when a specific aircraft-typed object was lit by the Sun, a request similar to the following might be made: 'when(Aircraft.isLitBy(Sun)'. This request may be interpretable, because an aircraft object ultimately inherits from the 'Entity' class of 'Things' which is allowed to make such a request. Additionally, the Sun, while being a planetary thing, also inherits from the concepts provided by a 'LightSource' thing, thus the request is compliant and can be executed through the proper delegate, which is presented at the formal type specified within the ontological information model.

In various embodiment, the interpretation and execution of the dynamic knowledge statement may be realized through these constituent, directed references to the underlying UML information model and the MEDUSA execution of the appropriate software delegate, thus spawning an in-process calculation request or activity instruction In various embodiments, the AMoEBA framework facilitates the management, execution, and simulation of UML modeled elements through the evaluation of multi-pointed decision criteria in labeled process flow graphs and finite state machines, as well as the underlying synchronization of state necessary in simultaneous integration of various simulation methodologies. Through semantically formalized execution statements, as simple calculation requests or complex trigger/action pairs, the embodiment AMoEBA framework leverages the MEDUSA environment to interpret and execute the supporting software delegates as described above in order to produce orchestrated calculation responses and/or temporal intervals of validity for evaluation. Given the nature of the tool delegates, AMoEBA may manage the request for information to produce a calculation response and ultimately an event for evaluation.

Figure 5:
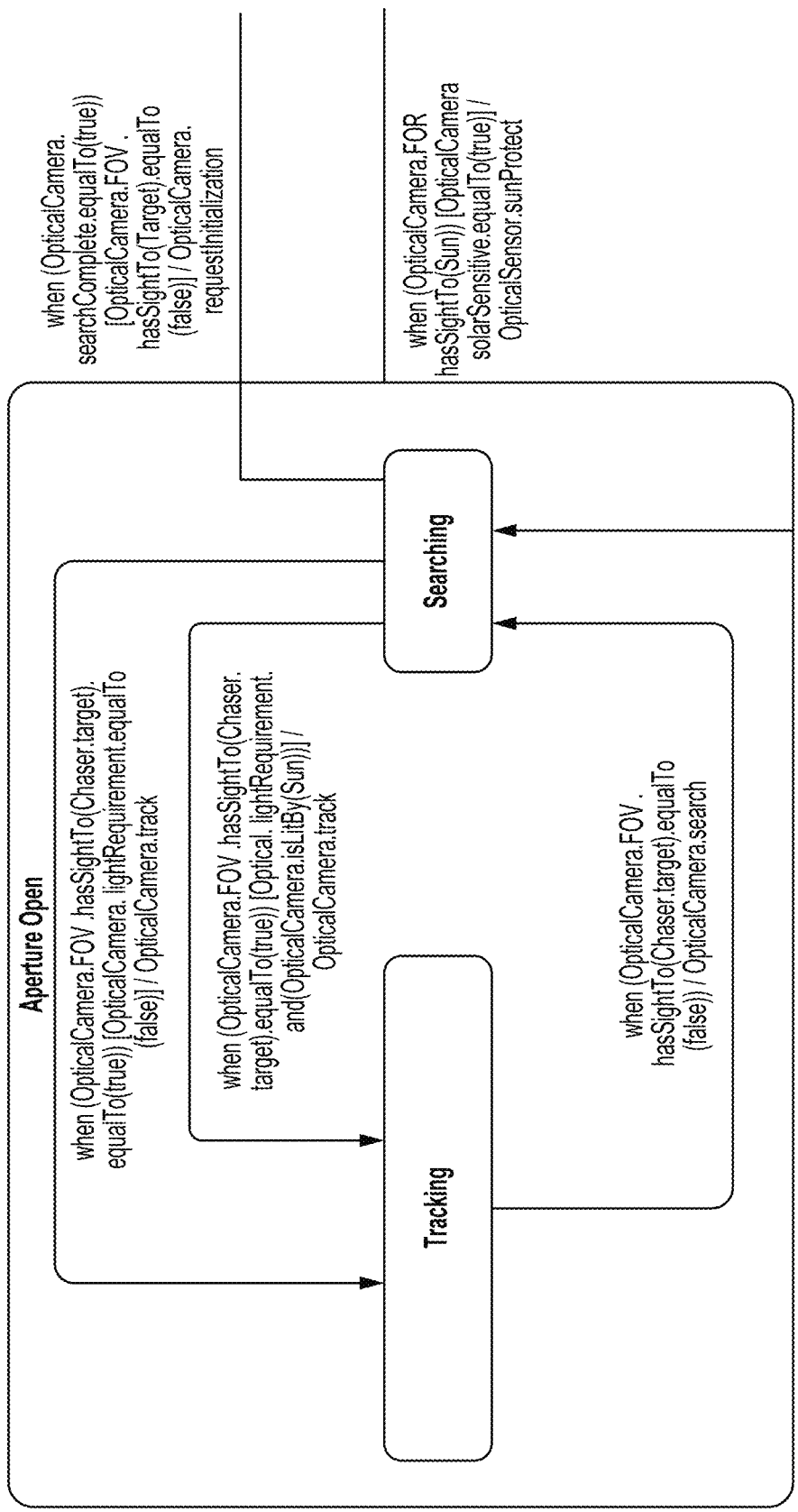
FIG. 5 illustrates an embodiment ontologically defined physics-constrained state machine.

The embodiment AMoEBA simulation framework facilitates the direct execution of physics-based state and activity transitions within agent behaviors modeled as UML hierarchical state machines and activity diagrams. The embodiment AMoEBA simulation framework may provide execution of the orchestrated simulation is foundationally discrete-event in nature. The embodiment AMoEBA simulation framework may enable simulation events based on algorithmic calculations or discrete-time signals, thus ensuring that interactions and propagated activities are never missed nor biased to an artificial simulation time-step. The embodiment AMoEBA simulation framework may evaluate MEDUSA interpreted expressions representing physics constraint calculations as generated discrete events and action pairs to initiate the realistic response of the underlying model. The embodiment AMoEBA simulation framework may intelligently execute and evaluate the interpreted expressions, given current agent states and simulation delegate type, whether continuous or discrete in nature. The embodiment AMoEBA simulation framework may determine the appropriate transition to fire and manages the state space across simulations. The embodiment AMoEBA simulation framework may execute MEDUSA interpreted action effect statements, as a consequence to transition firing. The embodiment AMoEBA simulation framework may manage the altered state space relative to new calculation requests and the ontological knowledge of dependency. FIG. 5 illustrates an embodiment ontologically defined physics-constrained state machine.

Figure 6:
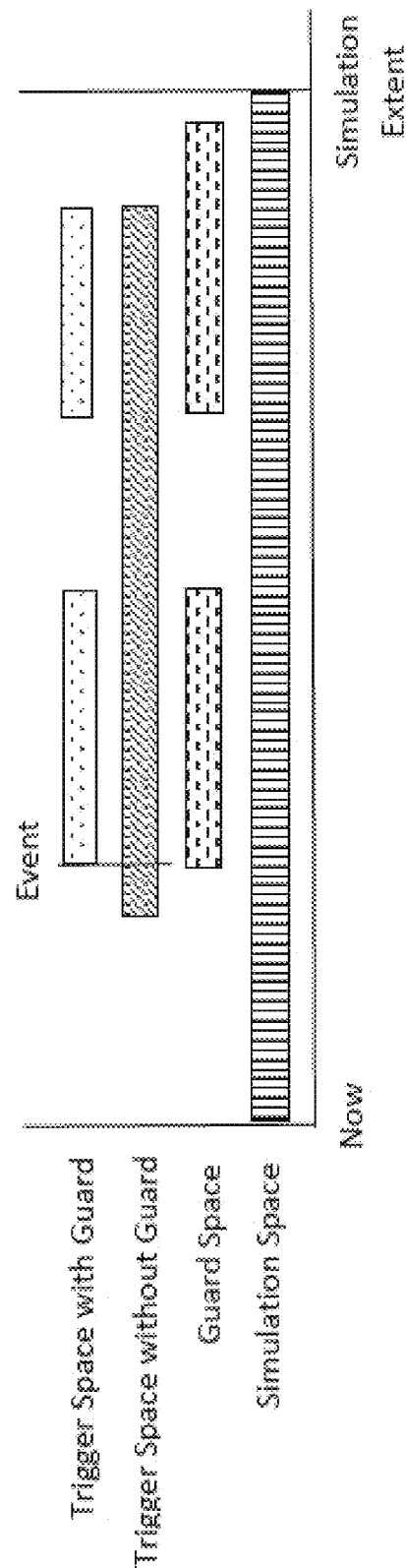
FIG. 6 represents the evaluation of a continuous model producing a future-looking trigger space, as combined with a confining 'guard' space.

In various embodiments, while the MEDUSA environment provides the ontological knowledge base for which integration delegates are constructed, the AMoEBA framework may require an additional event-generation adapter, given the simulation methodology of the tool responsible for the delegate. For example, a continuous simulation delegate would be handled differently than a discrete-time or discrete-event type in order to produce the desired temporal event for agent evaluation. The ontological information model also may include the concept of simulation, thus the formalization of continuous and discrete, with sub-types of time and event, can be captured as separate event generation types. For example, a specific STK delegate for an event-generation adapter of the continuous/algorithmic type may include the STK 'rangeTo' delegate leveraged within a 'when' trigger statement, such as 'when(Chaser.rangeTo.greaterThan(5, km)). The AMoEBA framework would generate a series of time intervals where that calculation evaluated to true within the scope of the current scenario simulation extent. For the case where the first occurrence is of interest, then the AMoEBA framework would return the event for this first threshold crossing as the time for trigger. If the above transition expression were to be combined with a guard statement, such as [Chaser.starTracker.hasSightTo(Sun)], then this evaluation would represent a new, refined Boolean search space for the when expression, as an alternative to the entire simulation space forward. The following graphic in FIG. 6 represents the evaluation of a continuous model producing a future-looking trigger space, as combined with a confining 'guard' space. The event in this case is the first evaluation of the trigger where the guard is also true.

In various embodiments, the AMoEBA framework may be responsible for performing similar evaluations for all transitions for all current states within the simulation, while regarding the different methodologies for producing an event given the nature of the simulation tool delegate. The priority of the transition may be governed by the authoritative descriptive model, which is in turn respected and interpreted by the AMoEBA kernel.

In various embodiments, the simulation delegate type may determine the evaluation execution methods. The purely algorithmic, continuous model produces sets of potentially discontiguous intervals without requiring the stepping of time. Transitions referencing discrete models may be run sequentially to find the next event while also being evaluated to not bypass potentially valid prior events produced by a continuous model. Discrete-event models may behave much like the AMoEBA framework in that they produce the raw events for comparison; though, the event generation criteria is internal to the tool, thus only exposed through the events. For the case of a discrete-time model, the AMoEBA kernel with knowledge of the specific time-stepping capabilities, the model's simulation delegate, may advance the model step-by-step, continuously evaluating the returned criteria for a match of the Boolean guard and the trigger change.

In various embodiment, transitions referencing purely continuous models may be evaluated first and run to completion in order to produce valid interval sets. Next, Discrete-event models may be stepped to their first event, whereby that event would be compared to those previously found. The discrete-event delegate specialization may determine which model to advance first, given the nature of the physics employed as mapped to the ontological information model. For example, a network simulation tool would likely be advanced first, as the interval between events is typically much smaller than a mission model. Finally, the discrete-time models may be advanced stepwise, while being evaluated against current continuous-generated and discrete events. If a continuous or discrete-event model produced a valid event prior to the current time step valuation, then the time-stepped evaluation may be halted and the prior event fired. The specific time-stepped model may be left in that state for the next transition involving this specific delegate instance and the process would continue. This alleviates the requirement found with many time-stepped models where time cannot be reversed and as such that model would require a cold start with the new simulation time. For the case of a discrete-event model, future-looking events may be potentially flushed, given the current nature of the simulation. Again, the complexities for the specific tool may govern the nature of the simulation adapter, as inherited from the basic concept of simulation and the sub-types of continuous/algorithmic and discrete, whether event or time stepped. Additionally, as activities are executed and state within the orchestrated tools and models have changed, in various embodiments AMoEBA may work through MEDUSA to determine and manage dependency in order to determine which tools and models need to be executed for the now current state transitions, produced from the most recent state change.

The UML ontological information model and executable architecture methodology may provide a future-proofing for new architectural concepts and descriptions where the separation and modularity of simulation/analysis methods, environmental/algorithmic models, and executable behavior models (doctrine, tactics and CONOPS) are possible. This may facilitate direct execution and the possibility of auto code-generation of system (structure and behavior) representations within desired development environments and proprietary formats for hardware and/or existing best-of-breed tools. This may allow for the achievement of full-spectrum analysis through a composite build-up of environment, blue-force architectures, threats complexes, and overarching doctrine executions.

Figure 7:
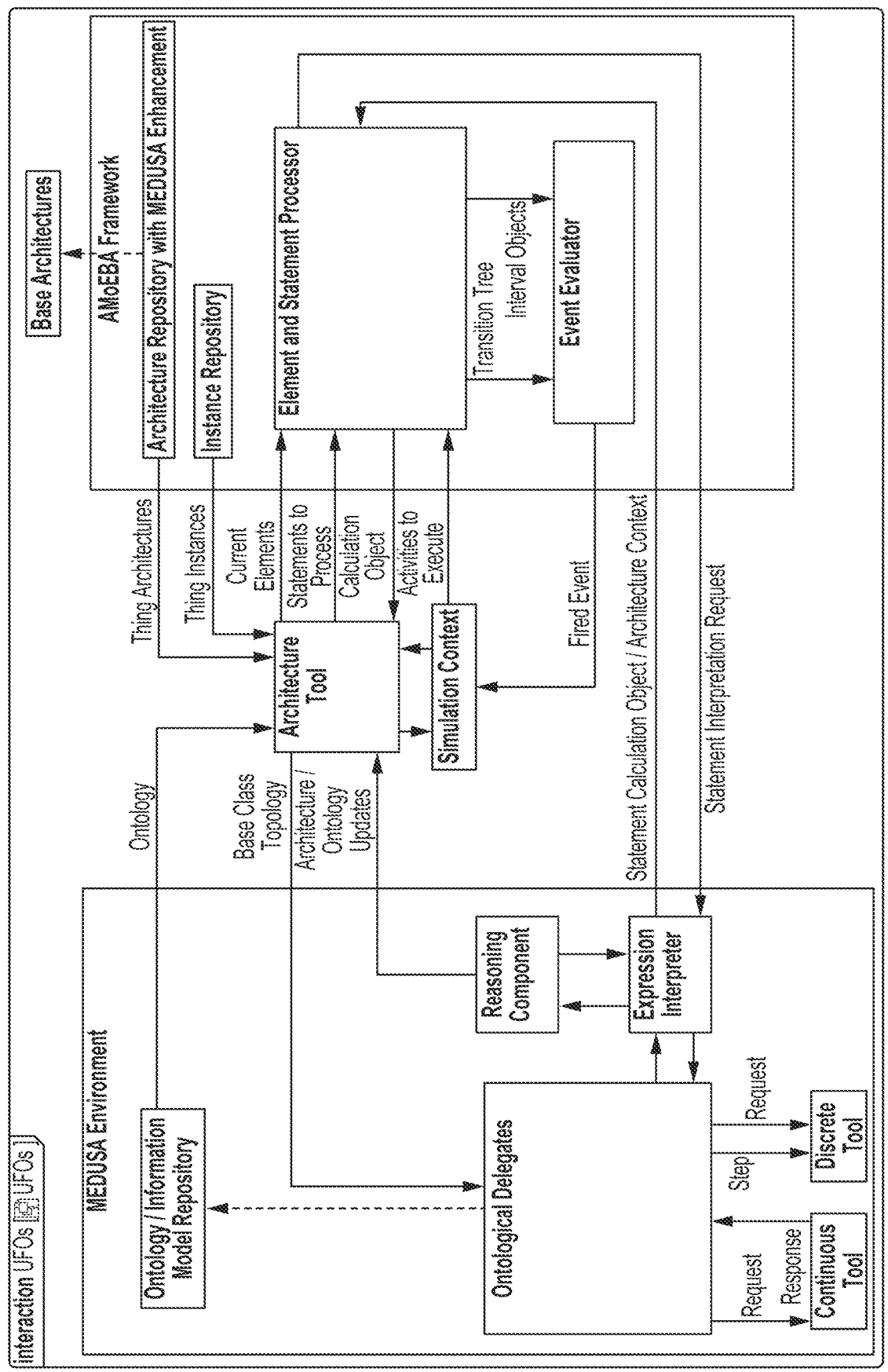
FIG. 7 illustrates an embodiment system including a MEDUSA environment and AMoEBA framework in communication with an architecture tool and simulation context.

FIG. 7 illustrates an embodiment system including a MEDUSA environment and AMoEBA framework in communication with an architecture tool and simulation context. Together the system including a MEDUSA environment and AMoEBA framework in communication with an architecture tool and simulation context may be a unifying framework for orchestration and simulation (UFOS). In various embodiments, the MEDUSA environment may include an ontological delegates module, reasoning component, expression interpreter, continuous tools, discrete tools, and ontology/information model repository. In various embodiments, the AMoEBA framework may include an architecture repository, such as an architecture repository with MEDUSA enhancement, an instance repository, an element and statement processor, and an event evaluator. The architecture tool may sit between the MEDUSA environment and AMoEBA framework and exchange information with and between the MEDUSA environment and AMoEBA framework. Additionally, a simulation context may interact with, and exchange information with, the architecture tool and the AMoEBA framework. Further, the MEDUSA environment and AMoEBA framework may interact directly with one another.

The architecture tool may output base class topologies to the ontological delegates module of the MEDUSA framework. The ontological delegates module may output steps and requests to the discrete tool and requests to the continous tool. The continuous tool may output responses to the ontological delegates module. The ontological delegates module may provide ontologies and information to the ontology/information model repository. Additionally, the ontological delegates module may exchange information with the expression interpreter. The expression interpreter may be configured to interface with the reasoning component. The reasoning component may output archtitecture/ontology updates to the architecture tool. The ontology/information model repository may output ontology to the architecture tool. The expression interpreter may send statement calculation objects/architecture contexts to the element and statement processor of the AMoEBA framework and receive statement interpretation requests from the same.

The architecture tool may receive thing architectures from the architecture repository, such as an architecture repository with MEDUSA enhancement, of the AMoEBA framework and thing instances from the instance repository of the AMoEBA framework. Current elements and statements to process may be sent from the architecture tool to the element and statement processor of the AMoEBA framework. The simulation context may send activities to execute to the element and statement processor of the AMoEBA framework. The element and statement processor of the AMoEBA framework may send calculation objects to the architecture tool and transition trees and interval objects to the event evaluator. The event evaluator may send fired events to the simulation context. Additionally, the architecture repository of the AMoEBA framework may provide information to base architectures outside the AMoEBA framework.

In an embodiment, efficient and scalable simulation and analysis framework may be achieved by separating the models, from the simulation execution, from the chosen methods for orchestration and/or analysis. In doing so, the analysis concepts, simulation architecture, and simulation execution may be abstracted and constructed in such a way to support inherent interoperability with diverse and best-of-breed models and tools assuming that the underlying context is well described and semantically grounded during data interchange.

In some embodiments, consistent simulation context and semantic agreement of data objects produced and consumed during transaction may be crucial in the design and construction of a model agnostic simulation infrastructure and orchestration framework. These may concepts necessitate a set of abstract base classes which formally describe the overall physics phenomenology, operational domain concepts, systemic functions, and methods for process interaction. The formal descriptor may capture the ontological relationships of objects and concepts and may become the basis for integration and thus the very mechanism to assure that data relevance is preserved with respect to well-typed hierarchical acknowledgement and compositional/aggregational association in reverence to relational dependencies. Similarly, the common vernacular may ensure consistency during object and data interchange and additionally subordinate meta-models may guarantee unit transformation for efficient orchestrated execution.

In various embodiments, the development and utility of an orchestration and simulation framework, UFOS (Unifying Framework for Orchestration and Simulation), may be founded on an executable architecture methodology allowing for the orchestration and examination of formalized process interactions. For example, a constituent agent framework, the AMoEBA (Agent Modeling of Event-based Architectures) framework may allow for the execution of semantically-formalized agent interactions representing doctrinal/policy motivations, systemic modes of operation, and human behaviors; constrained by integrated models, tools, and data imposing limitations, such as those realized through a holistic and multi-dimensional physics-based environment. In some embodiments, concept, system, and actor architectures constructed through these semantically formalized behaviors and physics constrained events may allow for non-developers and experts in the field to easily and graphically capture, vet, and adapt these models for analysis and simulation needs without being burdened with additional development translation and explanation. Architecture representations with performance limitations orchestrated through adapter-linked physics tooling and behaviors constructed graphically as state machine and activity diagrams utilizing the inherent semantic formalism may be easily explored with respect to parametric sensitivity discovery, system/concept mission utility, and course-of-action/what-if analysis. In addition, the architectural representations may be considered to fulfill both documentation requirements, while also serving as the very model for simulation playout and analysis discovery.

In an embodiment, the architected simulation infrastructure may allow for the marrying of discrete-event, discrete-time, and continuous simulation methods in order to capture and preserve the representative physics constraints as necessary to initiate the realistic response of the underlying model. The execution of the orchestrated simulation may be foundationally discrete-event in nature, while being moved forward by events which are algorithmic calculations or presented as discrete-time signals, thus ensuring that interactions and propagated activities are never missed nor biased to an artificial simulation time-step. In some embodiments, an adapter, such as a System's ToolKit (STK) mapped software adapter, may be implemented to realize various property and method implementations of the ontological information layer base class in order to provide algorithmic physics-based event determinations. When coupled with the state-machine behavior execution, the accurate preservation of spatial and temporal relationships and interaction feedback across all domains may be achieved.

In various embodiments, an open, industry standard for architecture capture may be used to facilitate graphical construction, examination, and vetting; while also exhibiting the important aspect of being inherently machine executable. For example, the Unified Modeling Language (UML) may be implemented to form the basis for the model definition through the provision of structural and behavioral mechanisms allowing for the capture of the doctrine, concepts, systems, and operational methods with semantic formalism, while depicting the models for review and vetting with an inherently graphical nature. The use of UML may provide various benefits including the use of ontologies, forming a set of domain specific languages, which may be used to formally describe the concepts/systems of interest in a human readable vernacular, while also lending to machine interpretation and execution. The structural elements of UML may provide the ability to capture structured knowledge and property-based information, while the behavioral elements allow for the representation of state machine and activity flows balanced by use-case descriptors. In an exemplary embodiment, the chosen tools-of-choice for architecture editing and execution, based on strict adherence to the UML standards and the provision of a robust discrete-event simulation interpreter and execution environment may be NoMagic MagicDraw™ with the Cameo Simulation Toolkit.

Additionally, a formalized behavioral language interpretation/execution engine which is designed to work with language adapters may be implemented, such as the one currently developed for UML, to allow for generic process descriptions and behavioral events/actions to be described through a user-defined ontological knowledge language, while also executing in adherence to the behavioral language semantics of UML.

The initial use-case that has been explored is the rendezvous, proximity operations, and docking aspects of a typical space shuttle when presented with the task of rendezvous with the International Space Station. The entire process has many permutations with respect to the CONOPS, making this a perfect use-case to examine the interactions of these systems from both physics and behavioral perspectives as synergistic limitations on the various approach methods being explored. However, the systems and/or methods described herein may be used in various situations and/or domains including land, sea, air, space, and cyber environments.

Figure 8B:
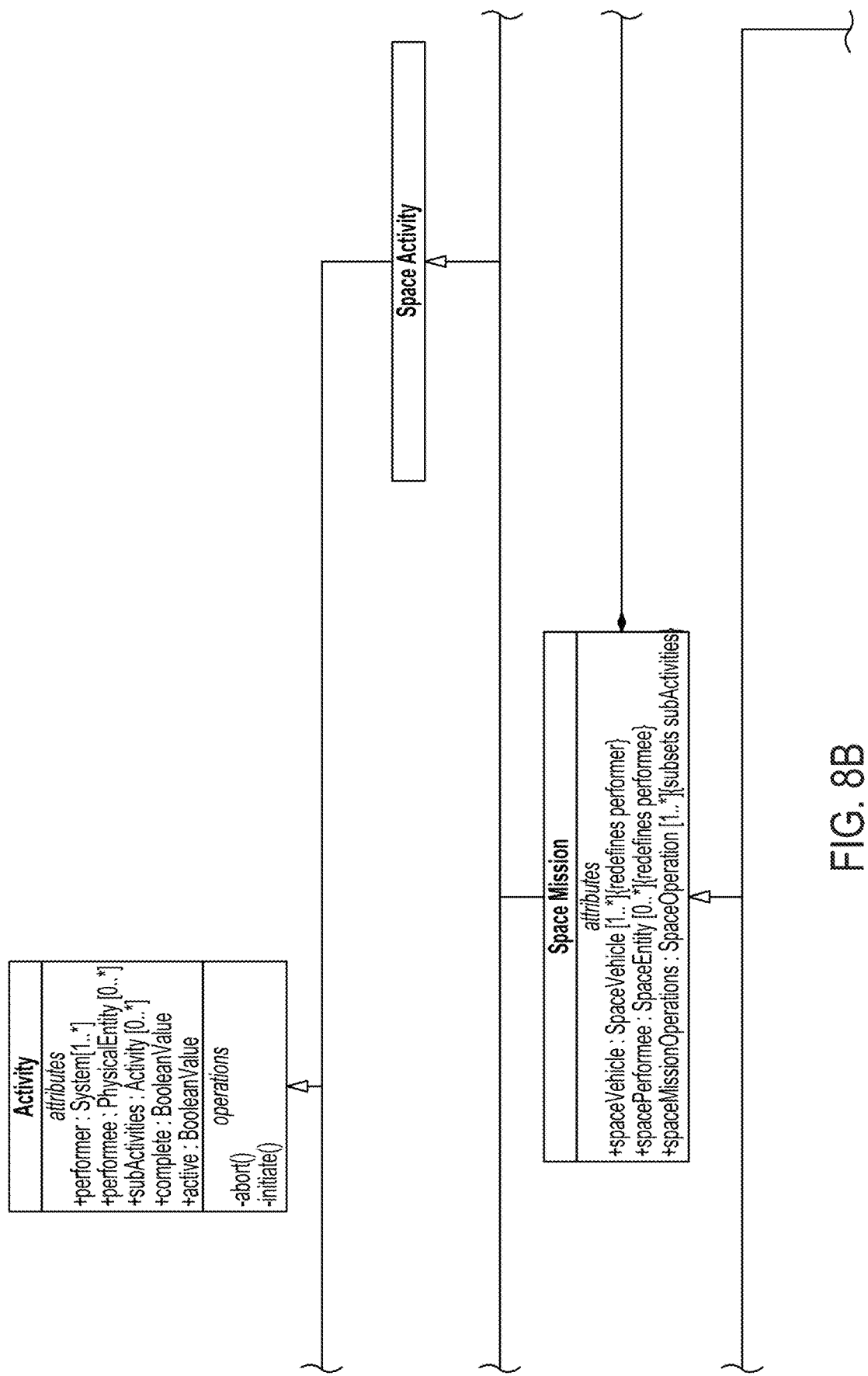
FIGS. 8A-8Q illustrate an embodiment ontological model.
Figure 8C:
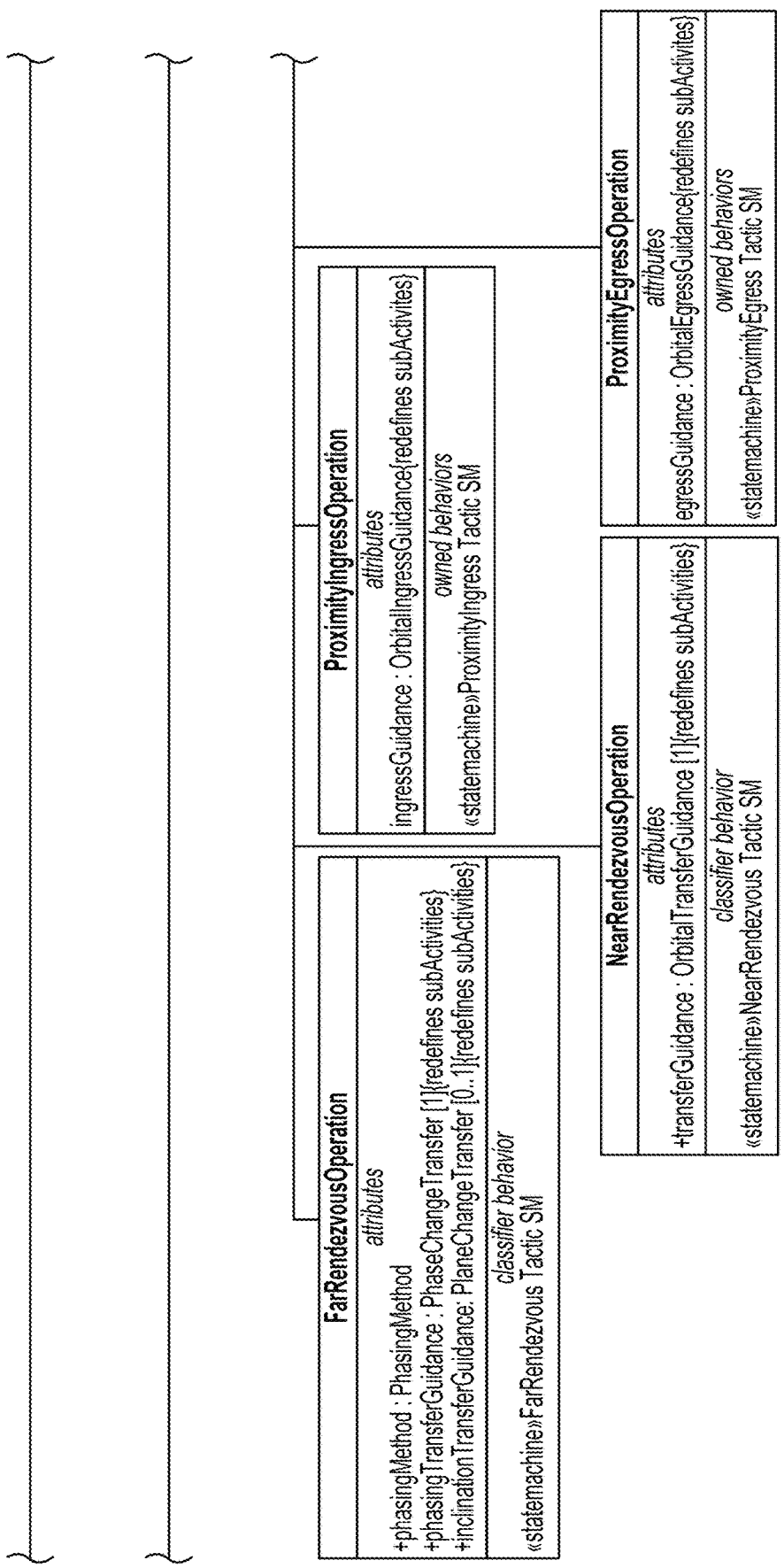
Figure 8D:
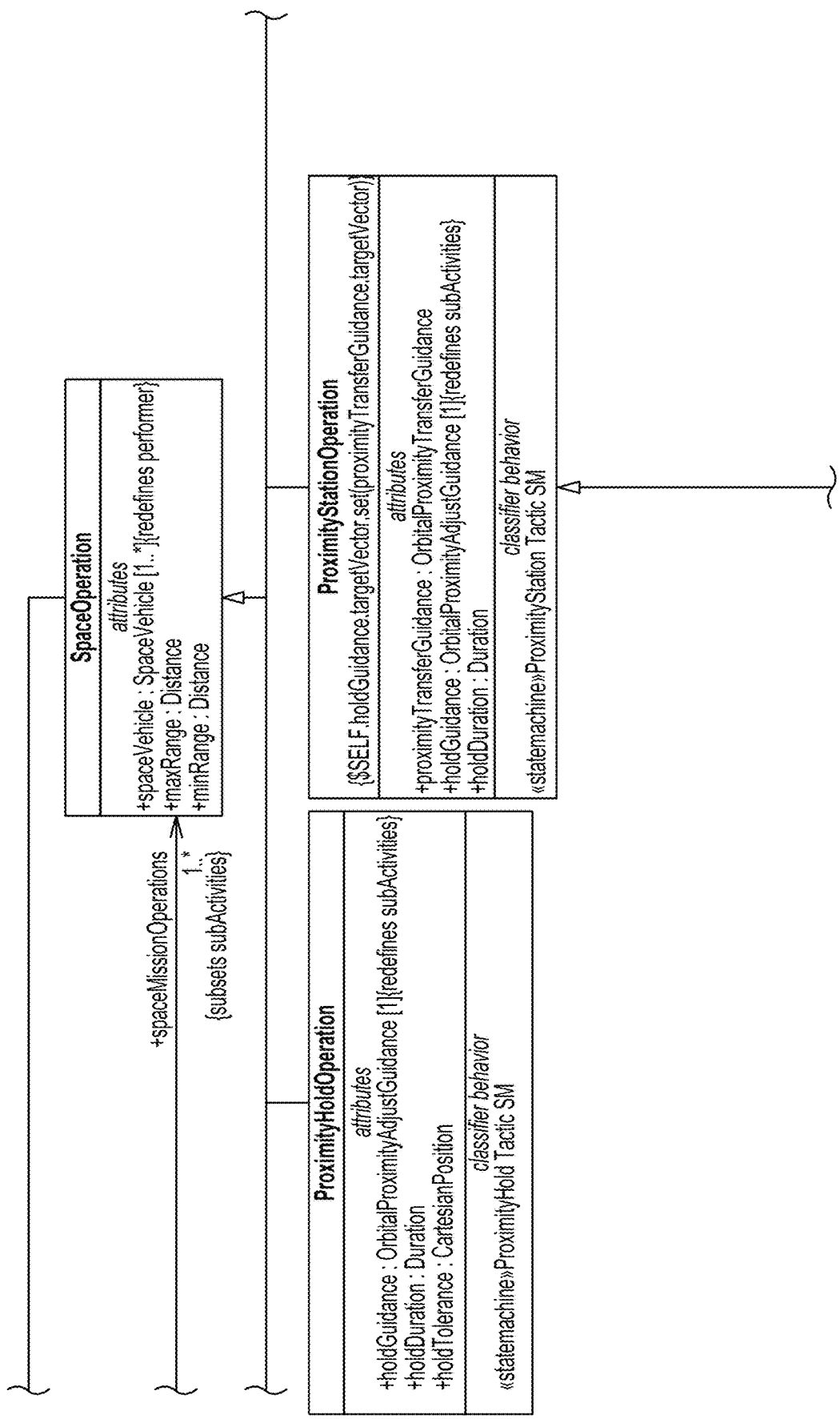
Figure 8E:
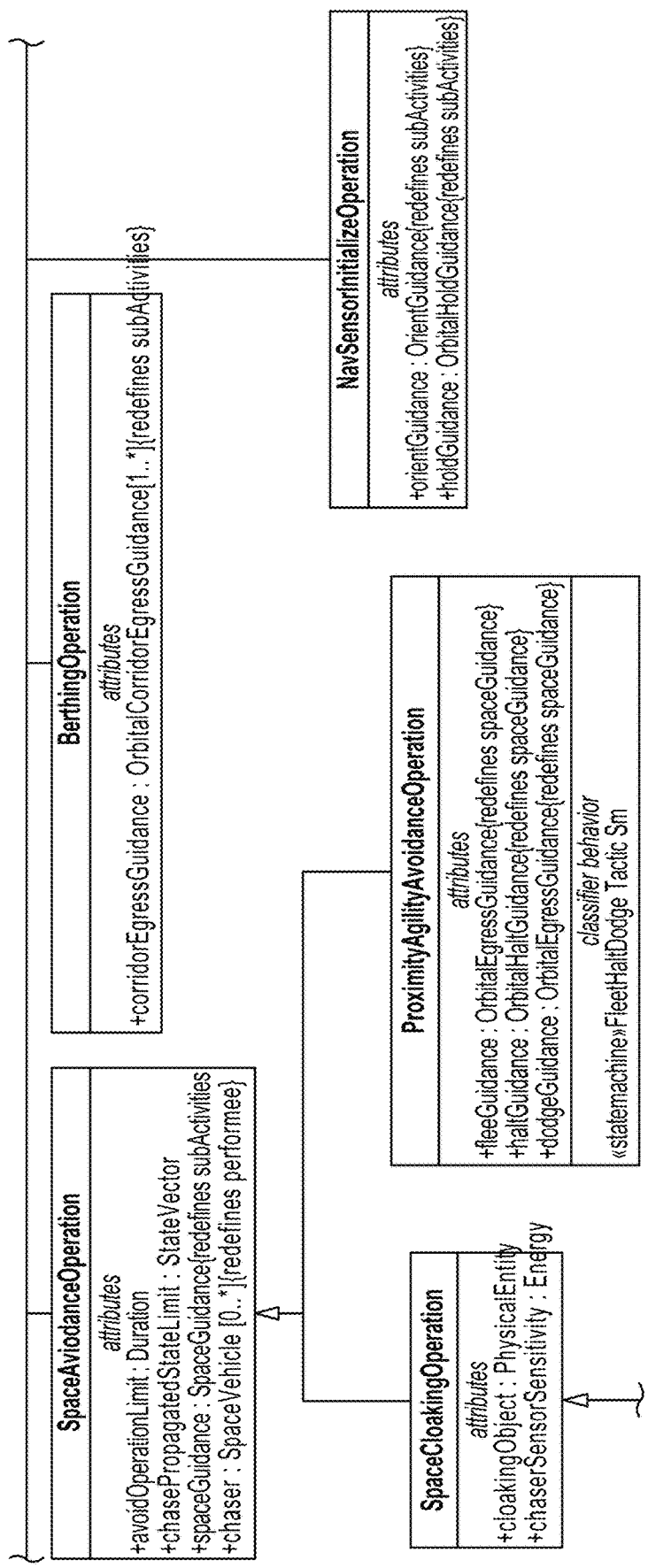
Figure 8F:
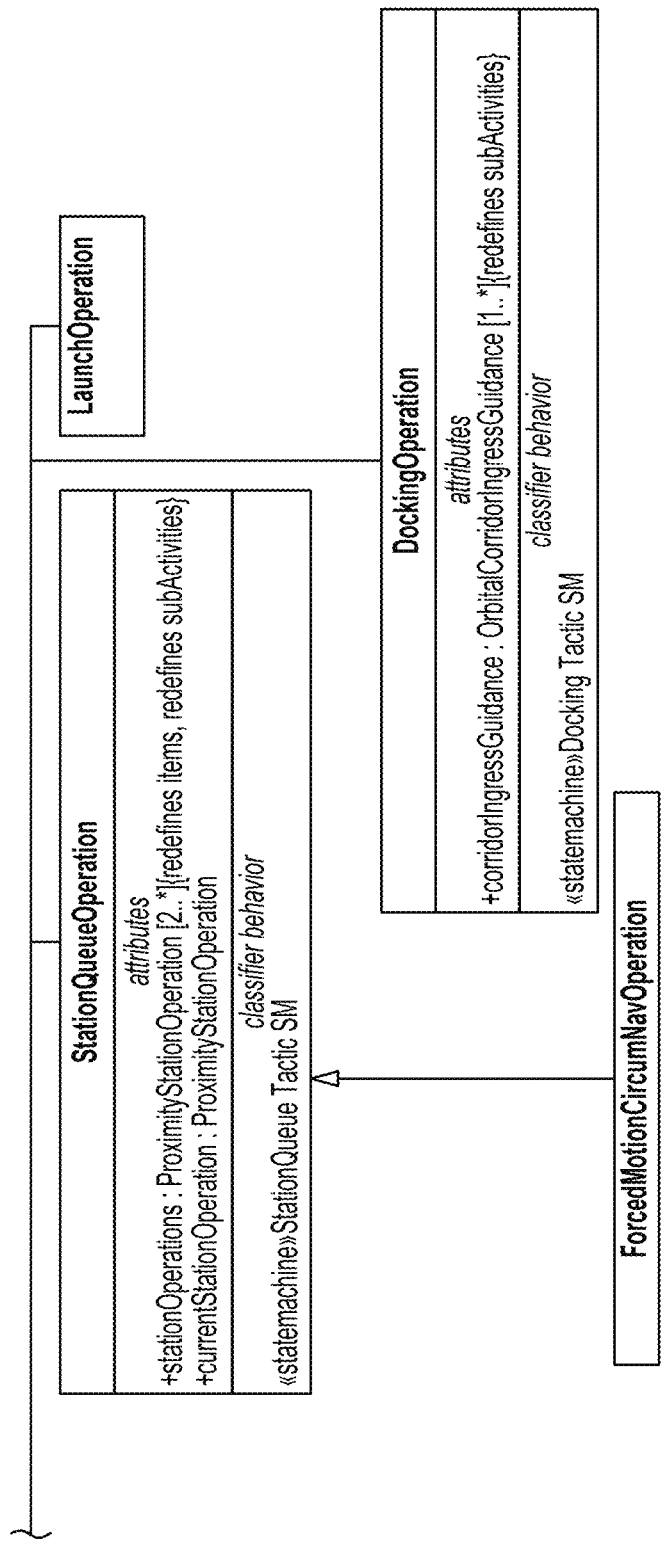
Figure 8G:
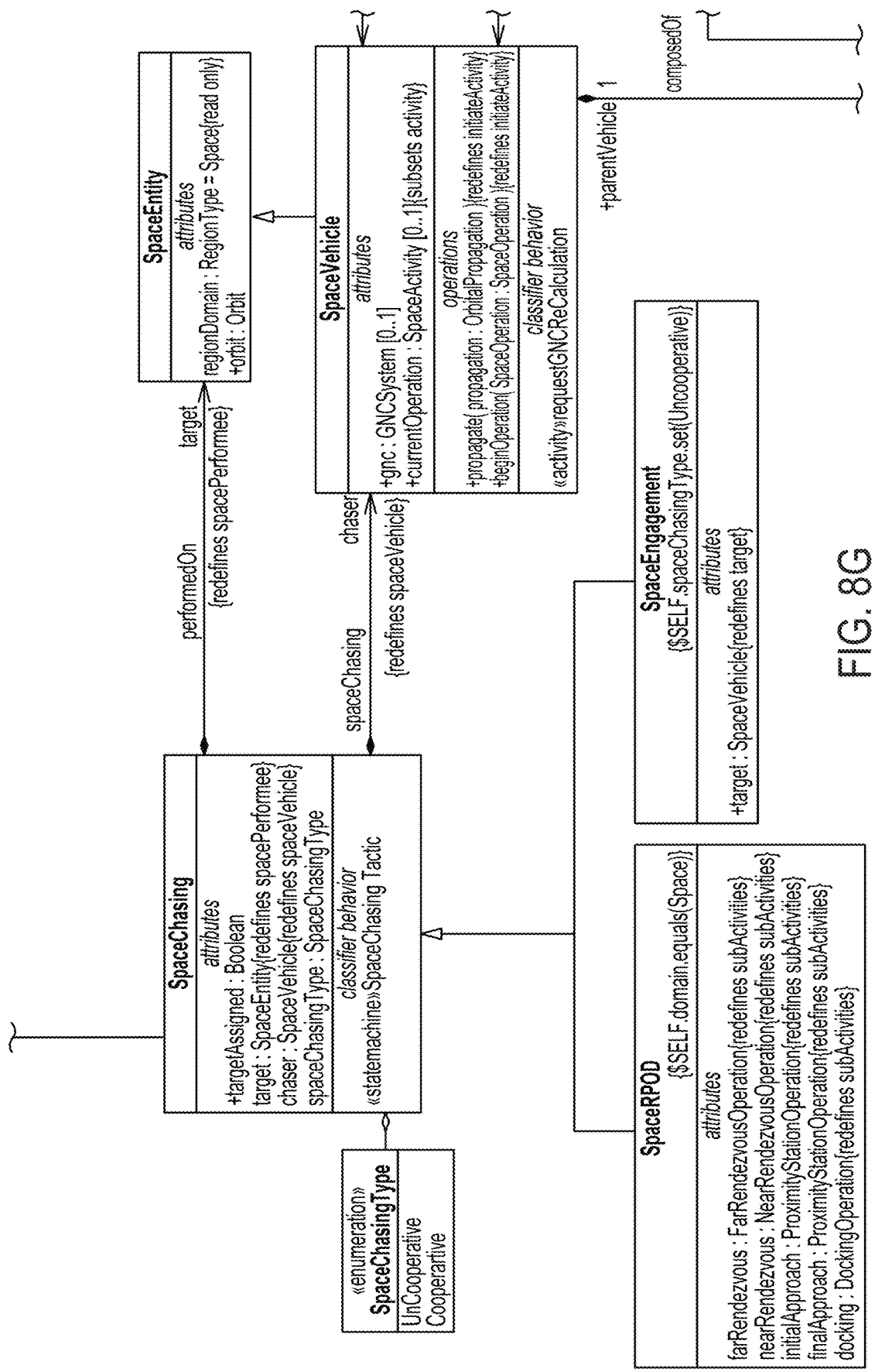
Figure 8H:
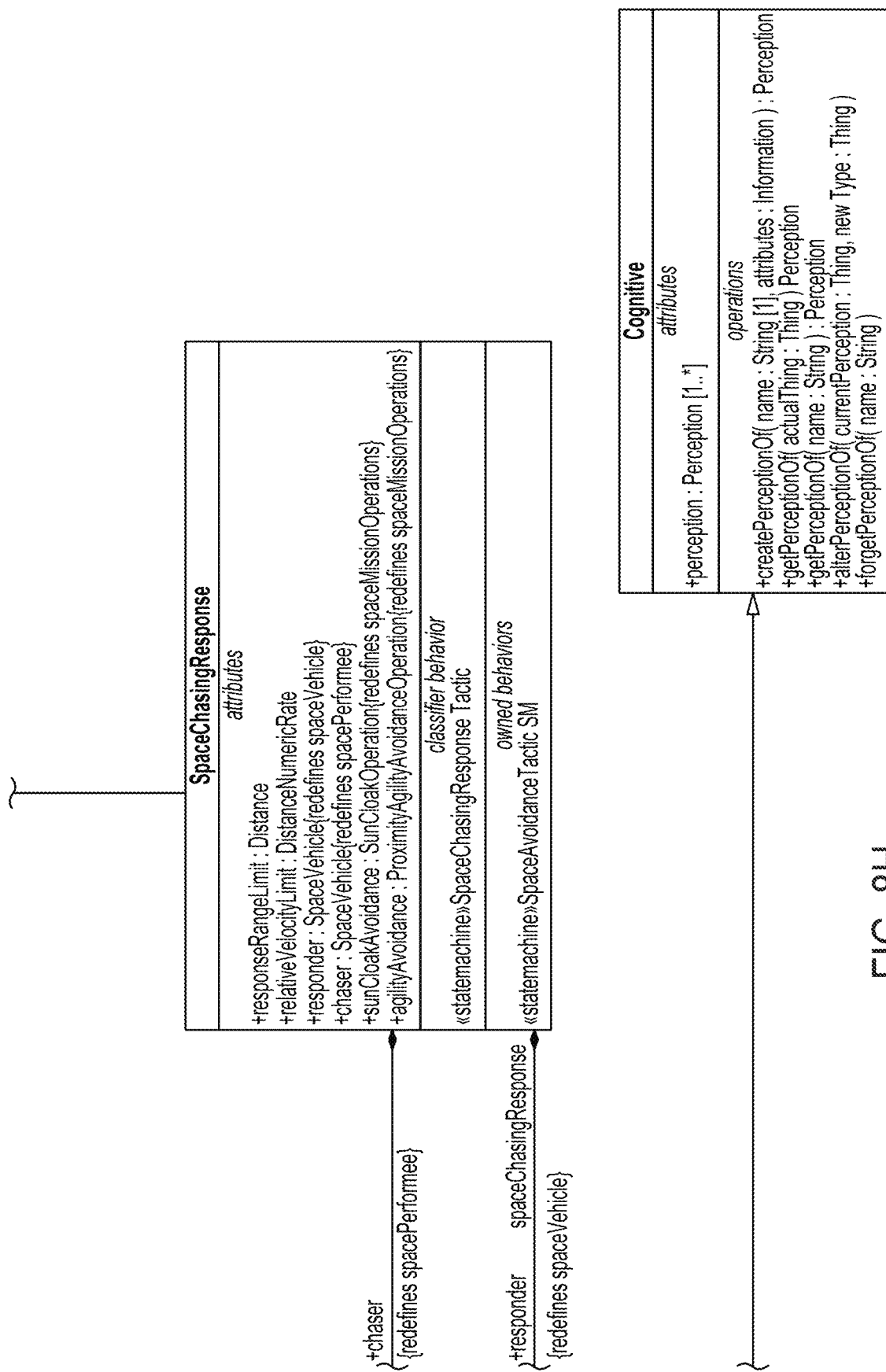
Figure 8I:
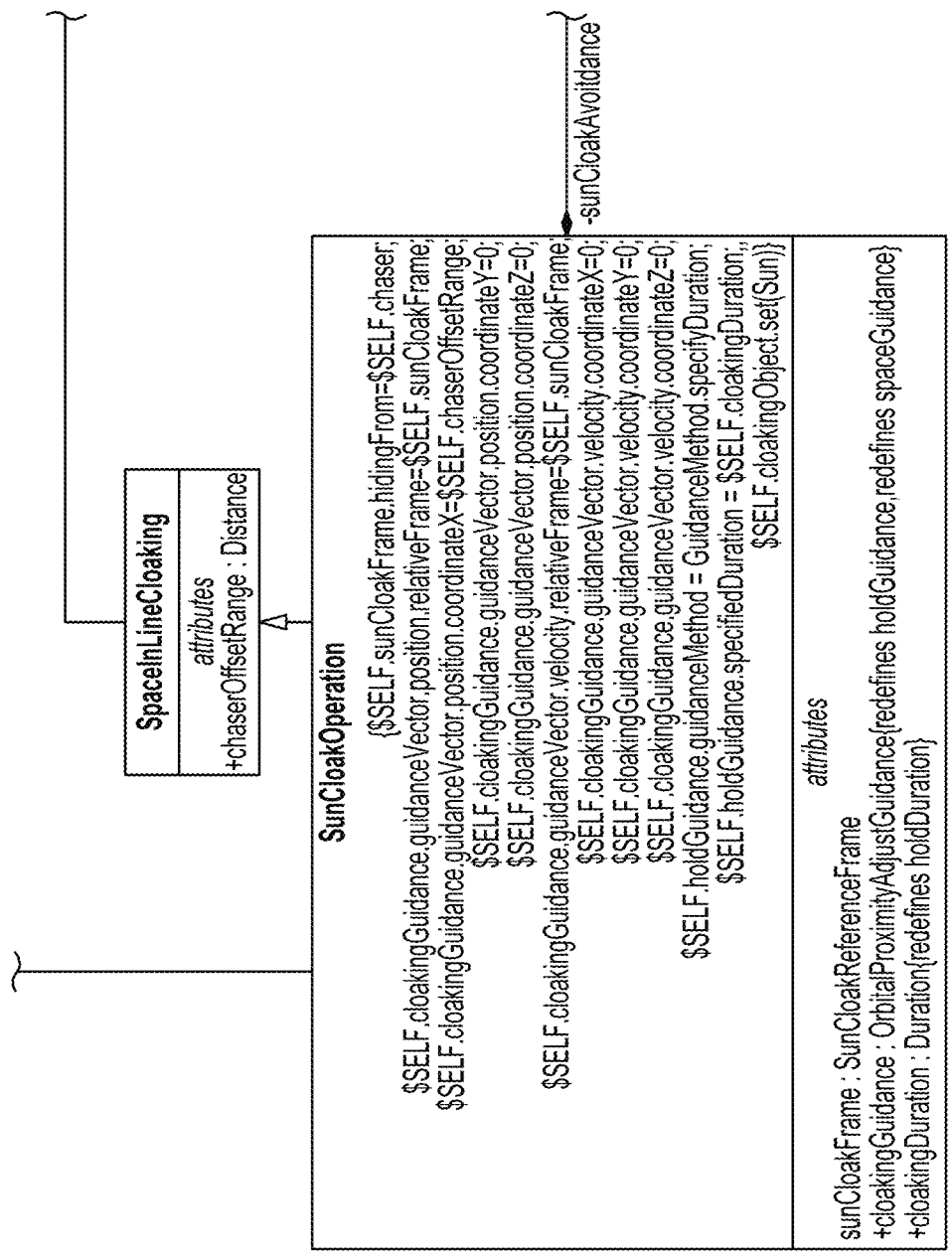
Figure 8J:
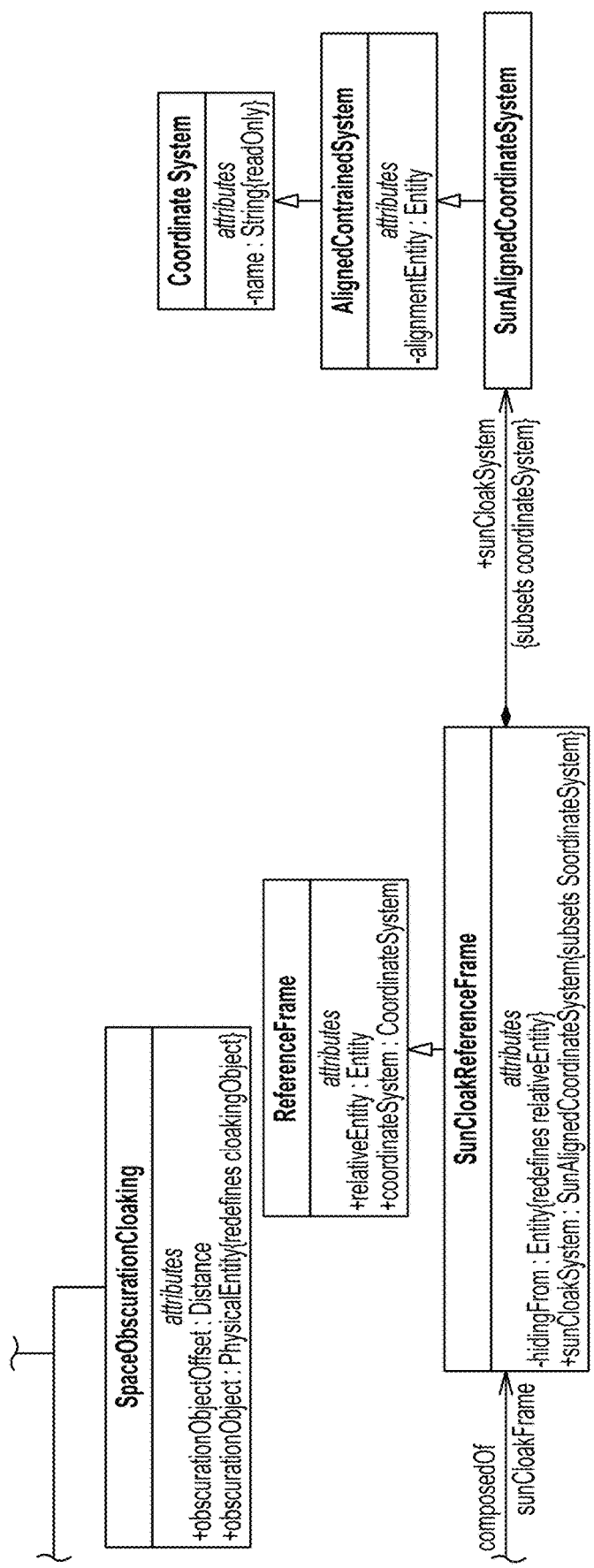
Figure 8K:
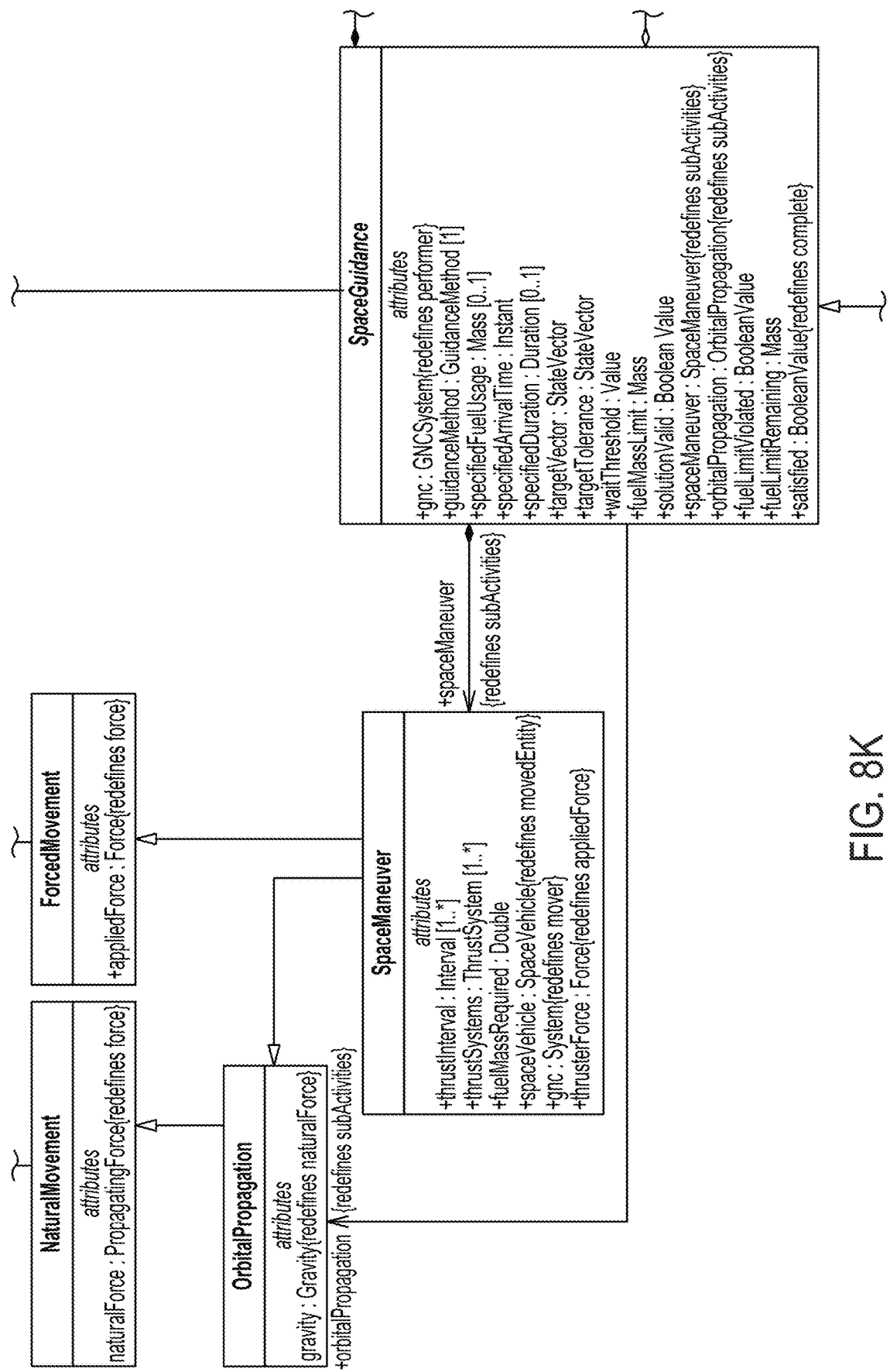
Figure 8L:
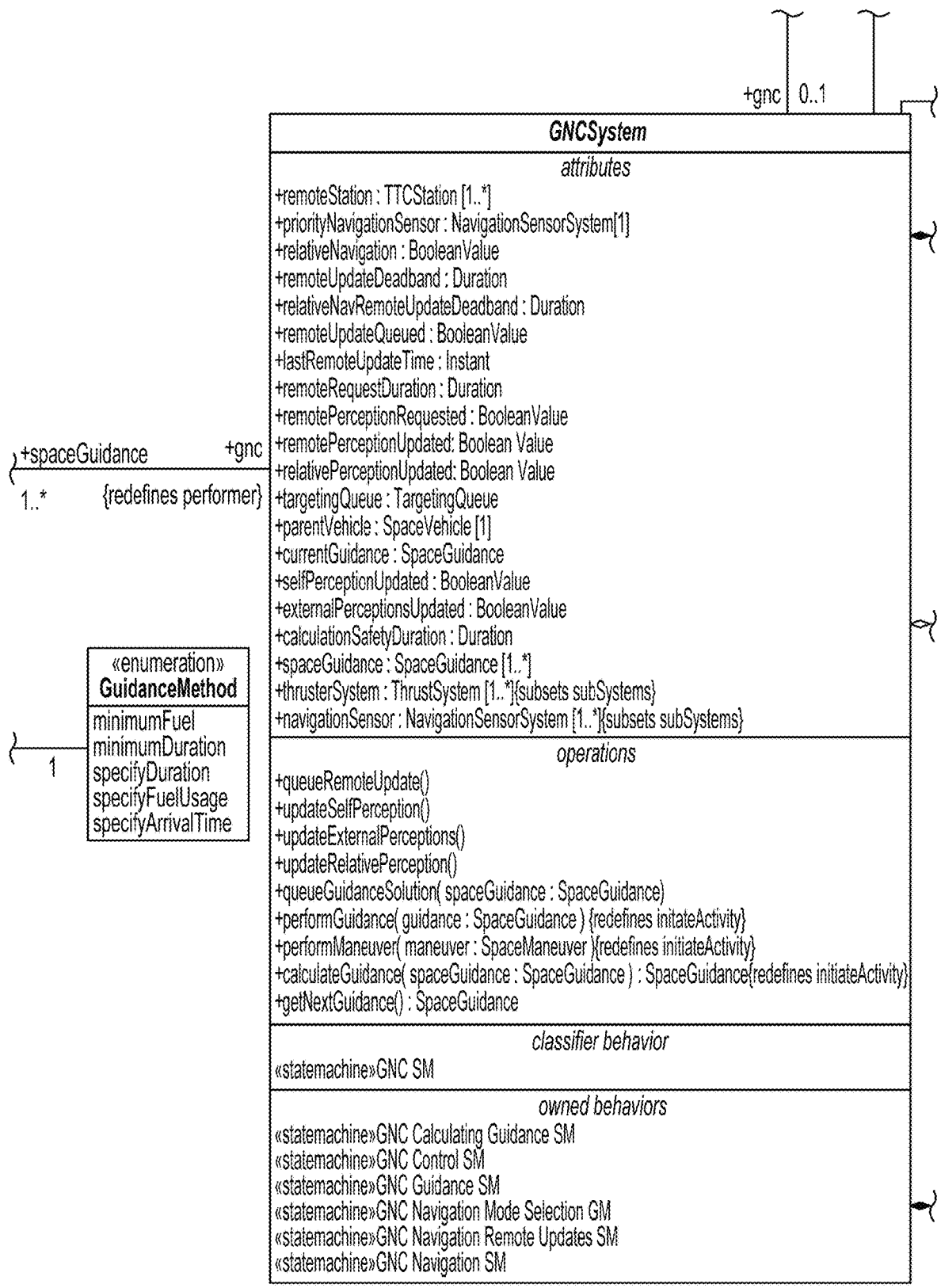
Figure 8M:
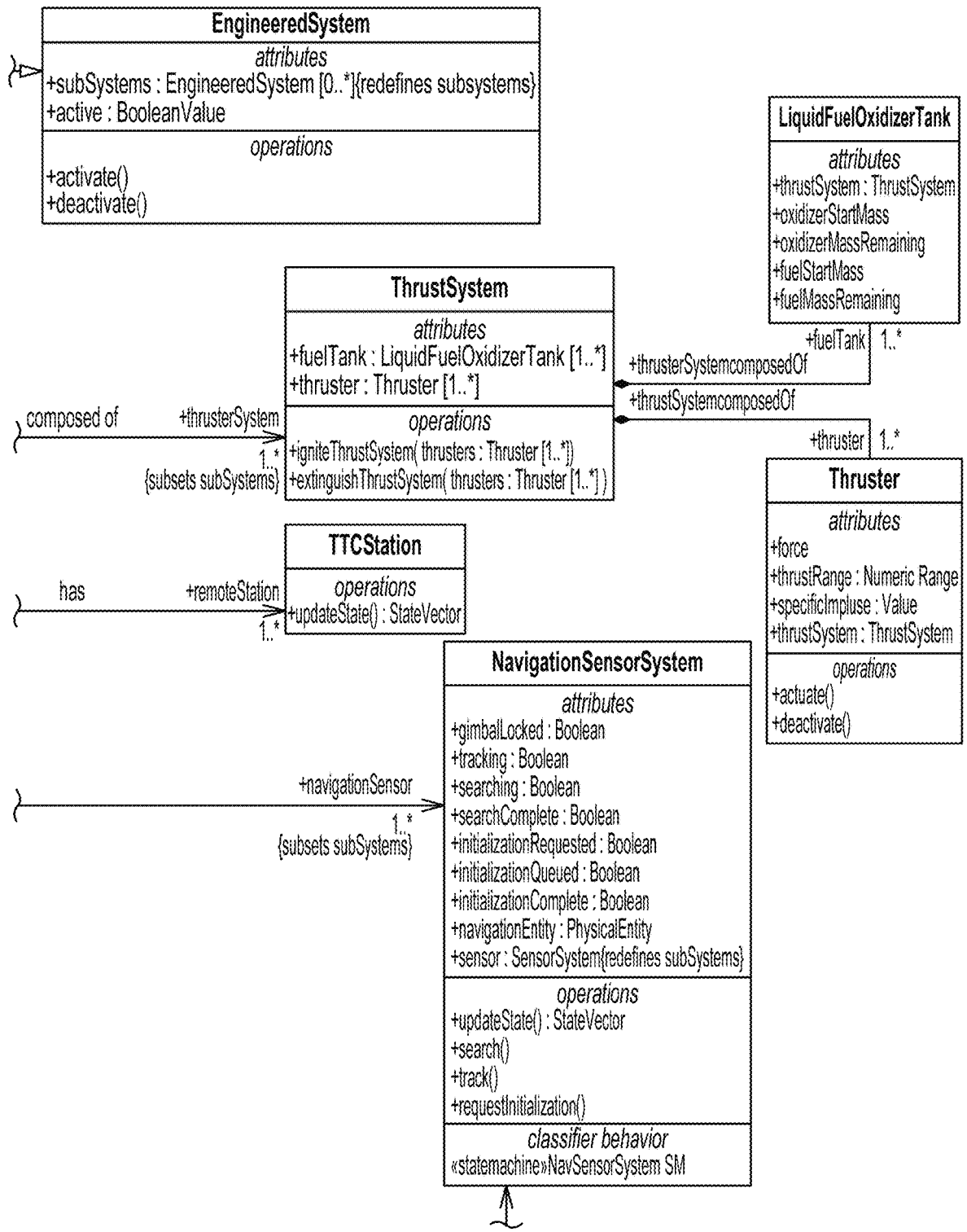
Figure 8N:
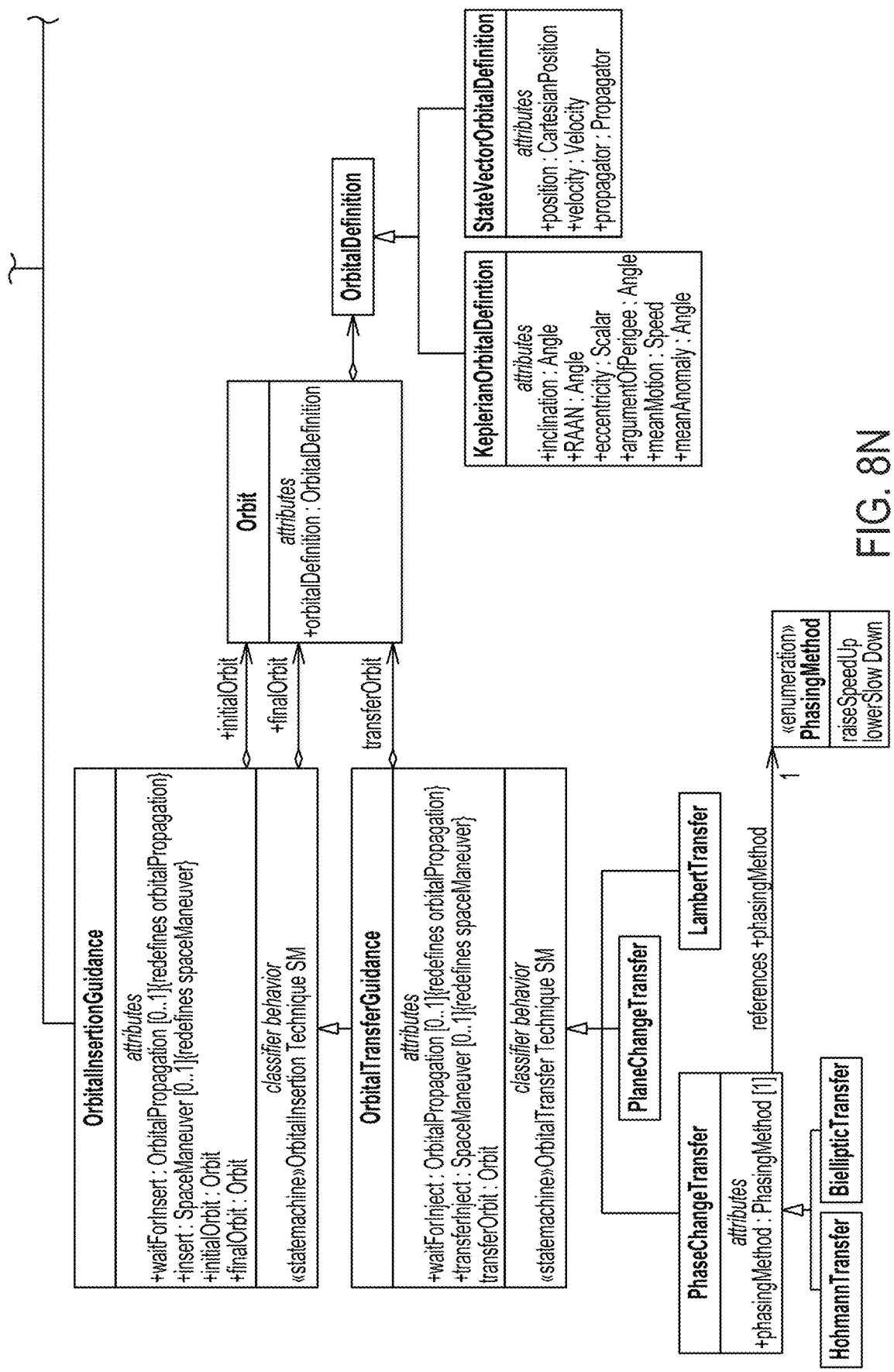
Figure 80:
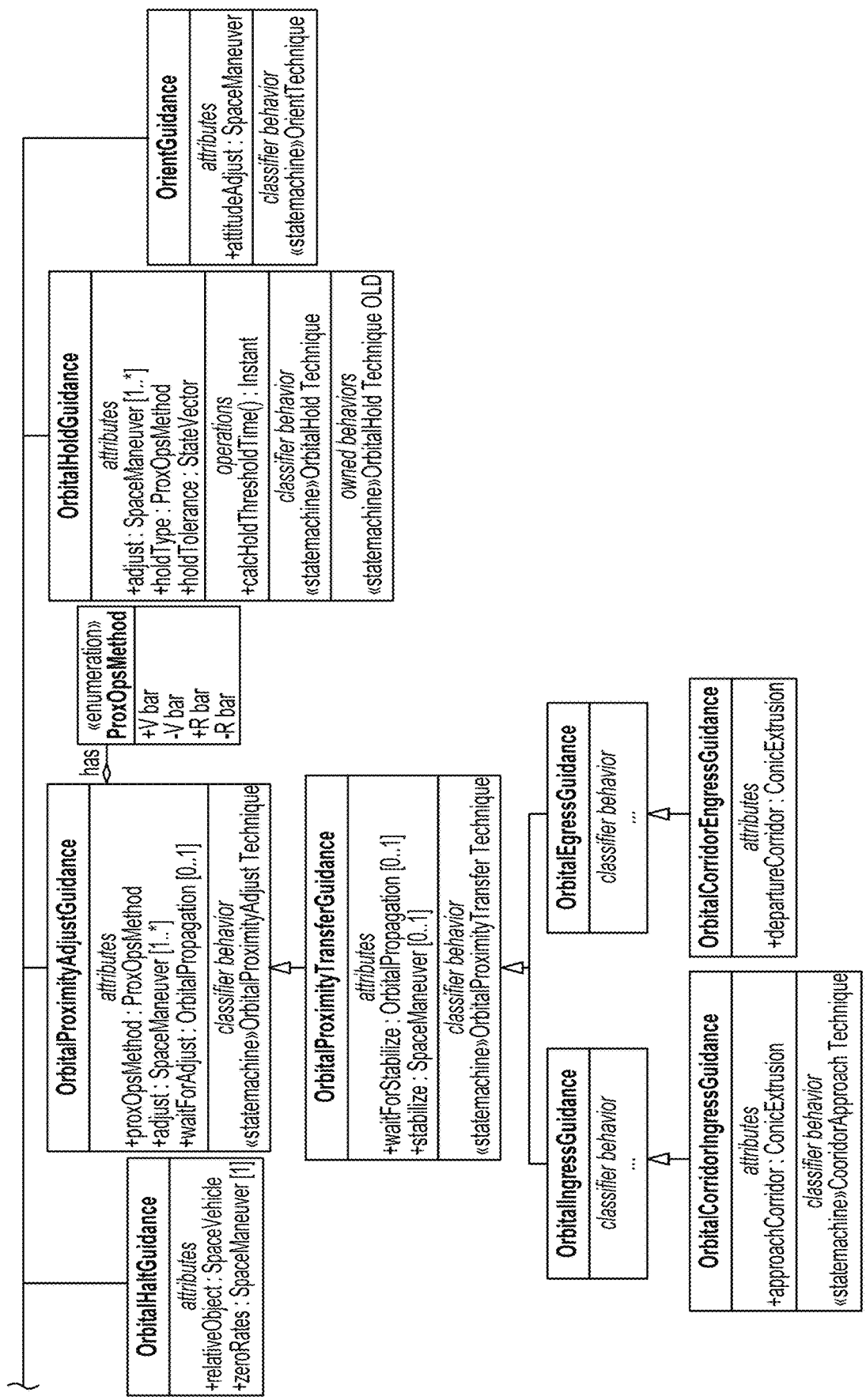
Figure 8P:
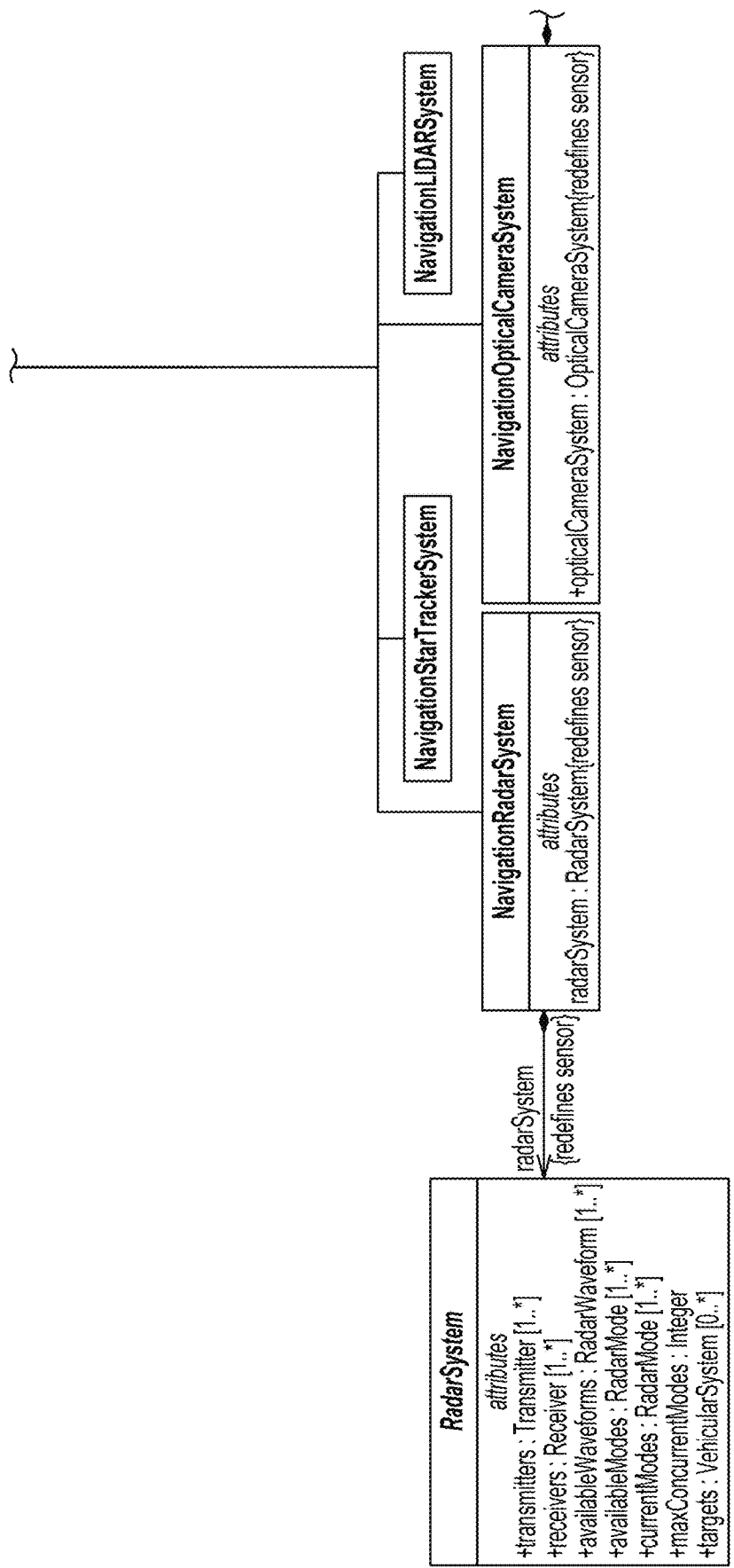
Figure 8Q:
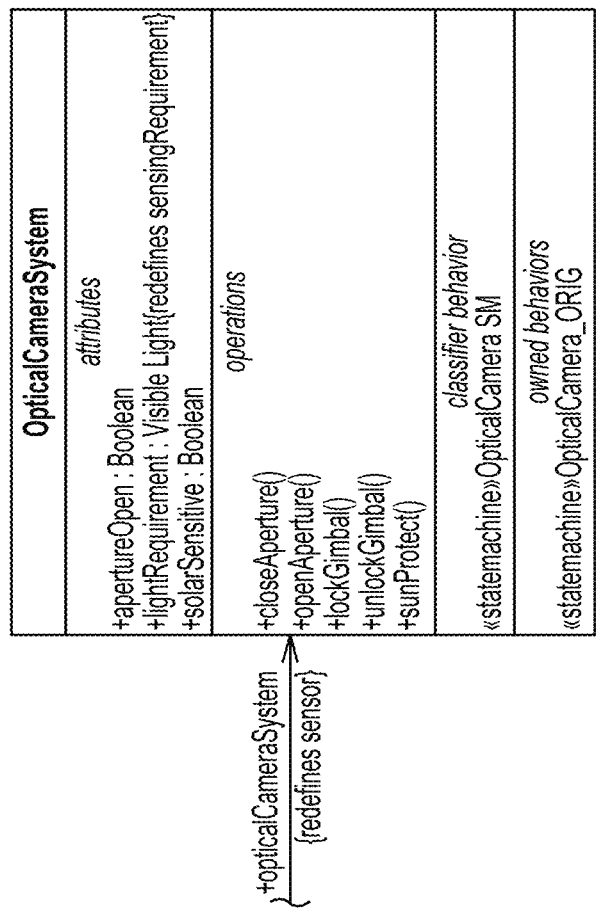
Figure 9A:
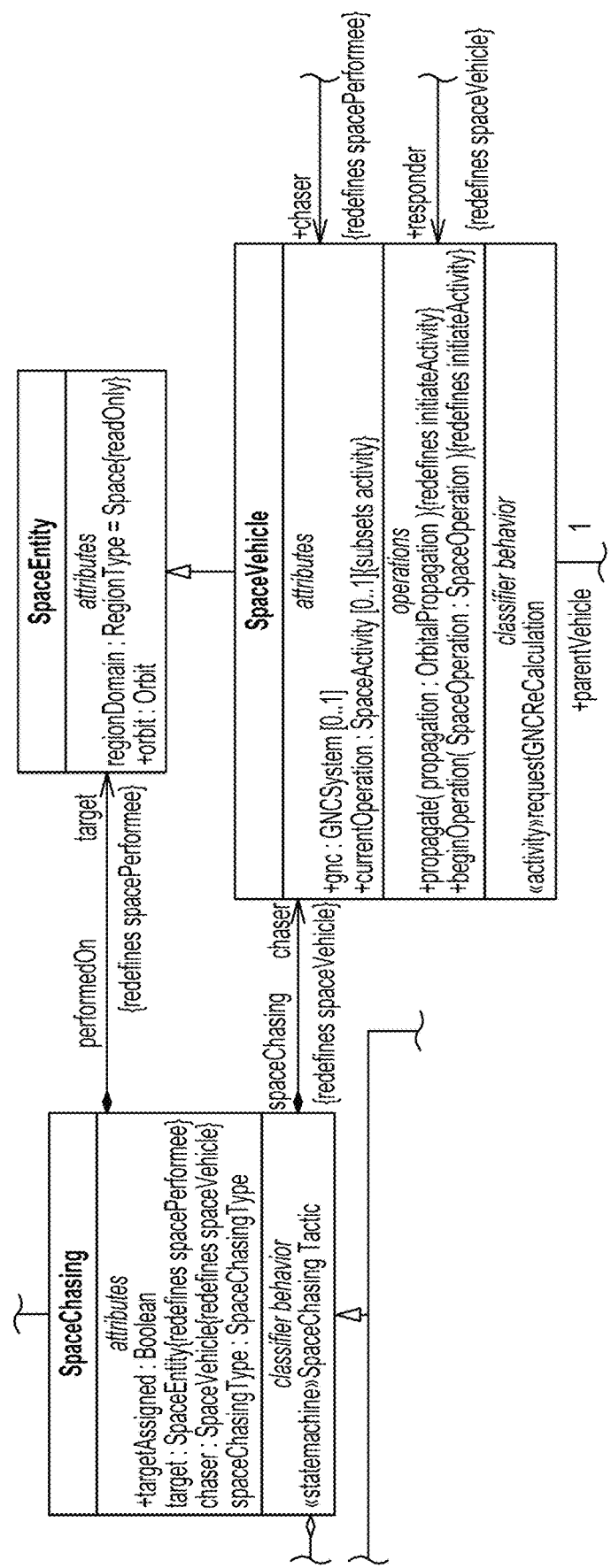
FIGS. 9A-9B illustrate an embodiment of another ontological model.
Figure 9B:
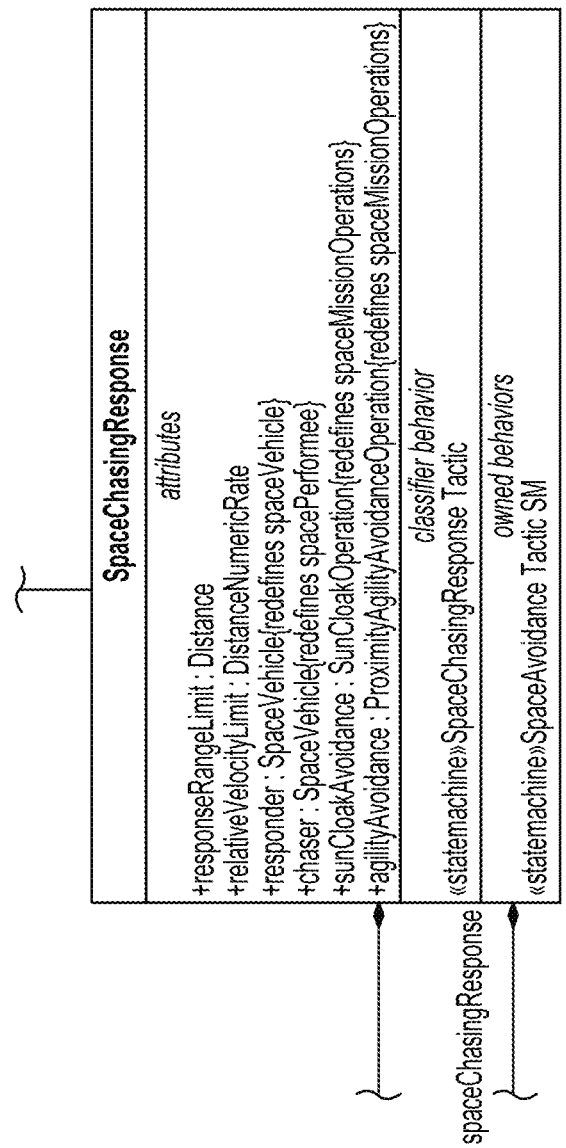

FIGS. 8A-8Q illustrate another exemplary ontological information model in UML. FIGS. 9A-9B illustrate a portion of an exemplary ontological information model that is associated with space chasing response activities.

Figure 10:
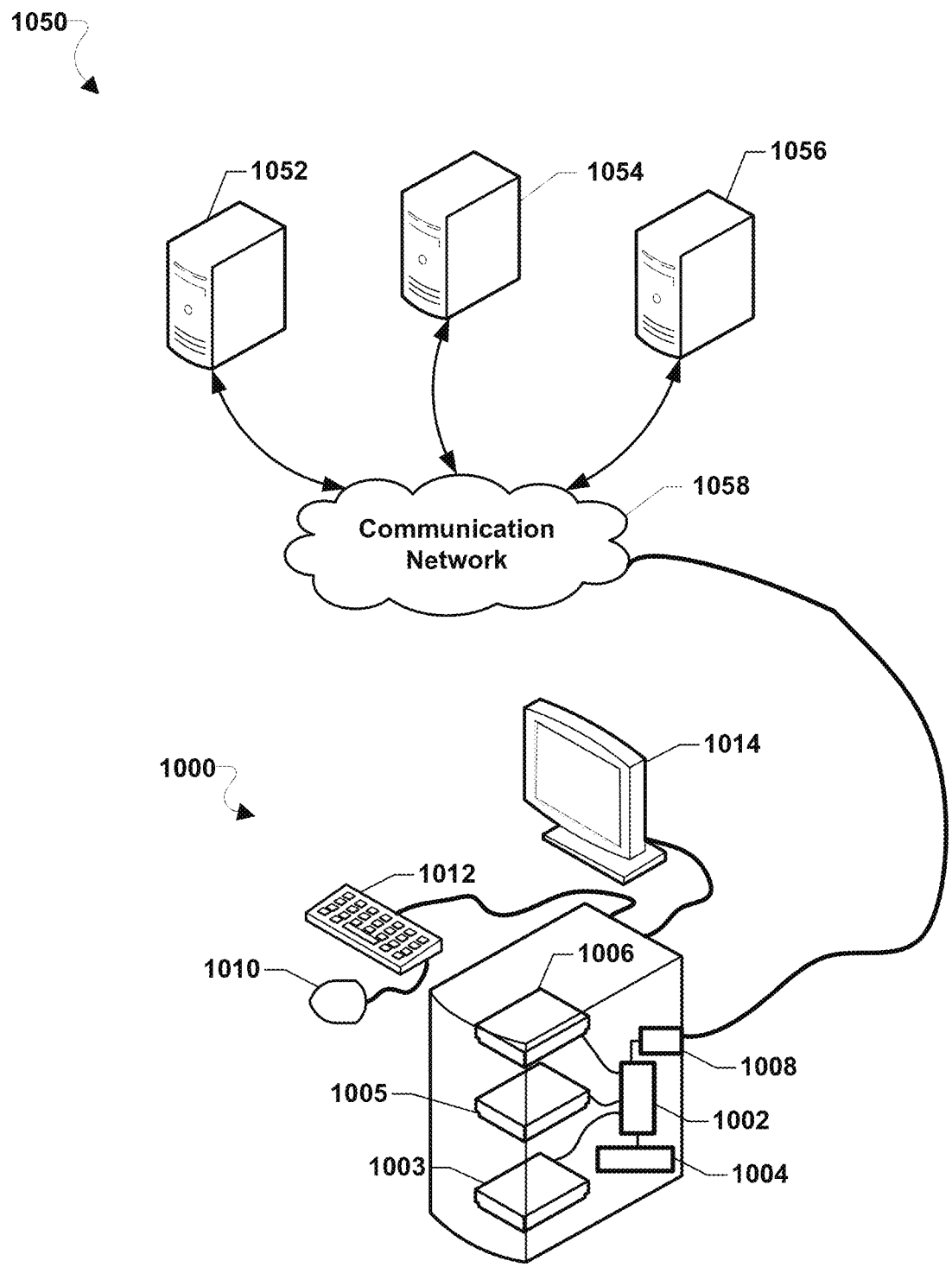
FIG. 10 illustrates a computing device and network suitable for use with the various embodiments.

FIG. 10 illustrates a computing device 1000 suitable for use with the various embodiments. The computing device 1000 may be a standalone device or the computing device 1000 may be in communication with network 1050.

The various embodiments may be implemented in any of a variety of computing devices, an example of which is illustrated in FIG. 10. A computing device 1000 will typically include a processor 1002 coupled to volatile memory 1004 and a large capacity nonvolatile memory, such as a disk drive 1005 of Flash memory. The computing device 1000 may optionally include removable memory devices such as a floppy disc drive 1003 and a compact disc (CD) drive 1006 coupled to the processor 1002. The computing device 1000 may also include a number of connector ports and/or communication interfaces 1008 coupled to the processor 1002 for establishing data connections or receiving external memory devices, such as a USB or FireWire® connector sockets, or other network connection circuits or interfaces for coupling the processor 1002 to a network, such as network 1050. The computing device 1000 may also include various input and output devices such as the trackball/mouse 1010, keyboard 1012, and display 1014 all coupled to the processor 1002.

The processor 1002 may be any programmable microprocessor, microcomputer or multiple processor chip or chips that can be configured by software instructions (applications) to perform a variety of functions, including the functions of the various embodiments described above. In some devices, multiple processors may be provided, such as one processor dedicated to wireless communication functions and one processor dedicated to running other applications. Typically, software applications may be stored in the internal memory before they are accessed and loaded into the processor 1002. The processor 1002 may include internal memory sufficient to store the application software instructions. In many devices the internal memory may be a volatile or nonvolatile memory, such as flash memory, or a mixture of both. For the purposes of this description, a general reference to memory refers to memory accessible by the processor 1002 including internal memory or removable memory plugged into the device and memory within the processor 1002 itself.

While the computing device 1000 may be a standalone system, in an optional embodiment, the computing device 1000 may be in communication with network 1050. The network 1050 may include one or more servers 1052, 1054, 1056. Each of the one or more servers 1052, 1054, 1056 may include one or more processors coupled to volatile memory, and may also include and a large capacity nonvolatile memory, such as a disk drive. Each of the one or more servers 1052, 1054, 1056 may also include a floppy disc drive, compact disc (CD) or DVD disc drive coupled to the one or more processors. Each of the one or more servers 1052, 1054, 1056 may also include network communication interfaces coupled to the one or more processors for, among other things, establishing network interface connections with the communication network 1058. Each of the one or more servers 1052, 1054, 1056 may also include output ports for providing content to a receive-only electronic device, and/or providing content to an output device, such as a display and/or a speaker.

The computing device 1000 may be in communication with the one or more servers 1052, 1054, 1056 as well as other network elements (e.g., gateways, routers, databases, etc.) via a communication network 1058. The communication network 1058 may be any type of network such as a wired network, a wireless network, a private network, a public network, or any combination thereof. Moreover, communication channels associated with the communication network 1058 may be any type of wired communication channel, wireless communication channel, or a combination thereof. For example, the communication network 1058 may be a local area network coupled to other broadcast system computers and servers, a wide area network, a content data network, the public switched telephone network, and/or a cellular/wireless data network (e.g., CDMA, TDMA, GSM, PCS, 3G, 4G, LTE, or any other type of cellular/wireless data network).

In some embodiments, the computing device 1000 may communicate with one or more servers 1052, 1054, 1056 such that any of the methods described herein may performed by one or more of the computing device 1000, and the one or more servers 1052, 1054, 1056. For example, model information (e.g., ontological model information, agent behavior model information, agent model information, etc.) may be stored in various locations. In addition, simulation orchestration, analysis, and/or execution may be performed by one or more of the computing device 1000, and the one or more servers 1052, 1054, 1056 prior to displaying the simulation or a graphical representation of the simulation executable code.

Figure 11:
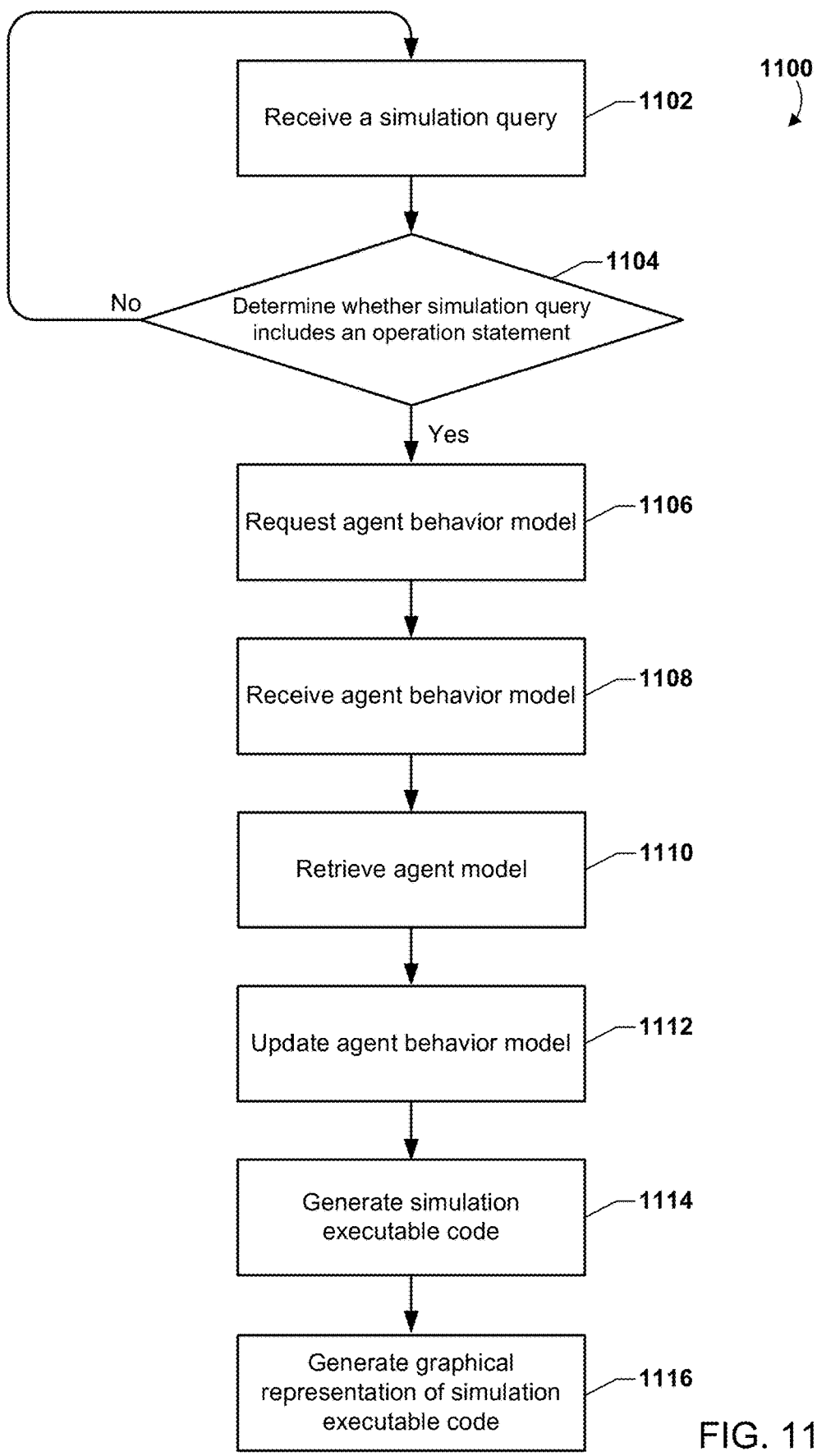
FIG. 11 is a process flow diagram illustrating an embodiment method for generating a graphical representation of simulation executable code.

FIG. 11 illustrates an embodiment method 1100 for generating a graphical representation of simulation executable code. In an embodiment, the operations of method 1100 may be performed by one or more processors of a computing device (e.g., processor 1002 and/or processors of servers 1052, 1054, 1056).

In block 1102, the processor may receive a simulation query. In some embodiments, the simulation query may include an agent identifier associated with one or more agents requested to be included in a simulation. For example, the simulation query may include "when(Aircraft.isLitBy(Sun))", "when(Chaser.rangeTo.greaterThan(5, km))", "[Chaser.starTracker.hasSightTo(Sun)]".

In decision block 1104, the processor may determine whether the simulation query includes an operation statement. For example, the processor may parse the simulation query to identify whether the query includes an operation statement. In addition, the processor may identify information associated with one or more objects such as an agent identifier and/or conditional statements included in the simulation query.

In an exemplary embodiment, when the simulation query "when(Aircraft.isLitBy(Sun))", the processor may identify "isLitBy" to be an operation statement, "Aircraft" and "Sun" to be information associated with two objects, and "when" to be a conditional statement.

In response to determining that the simulation query does not include an operation statement (i.e., determination block 1104="No"), the processor may return to monitor for another simulation query. Otherwise (i.e., determination block 1104="Yes"), the processor may request an agent behavior model based on one or more agent identifiers included in the simulation query in block 1106.

In block 1108, the processor may receive the requested agent behavior model from a Unifying Framework for Orchestration and Simulation (UFOS) environment. In an embodiment, the requested agent behavior model may include an agent information placeholder.

In block 1110, the processor may retrieve an agent model of the agent to be included in the simulation. The agent model may be retrieved from a memory based on the agent identifier included in the simulation query.

In some embodiments, the information associated with an agent model and the information associated with the agent behavior model may be stored separately. For example, the information associated with the agent model may include characteristics associated with the attributes and/or operations of the agent. Any information associated with one or more of the physics phenomena attributable to the agent and/or the environment/domain, domain concepts, systemic functions, and process interactions in the abstract may be accessed, processed, and/or stored separately from the agent model information.

In block 1112, the processor may update the agent behavior model to replace the agent information placeholder with information included in the retrieved agent model.

In block 1114, the processor may generate simulation executable code by compiling the source code of the received agent behavior model and the retrieved agent model.

In block 1116, the processor may generate a graphical representation of the simulation executable code to display on a display of the computing device. The graphical representation may include icons defined using Unified Modeling Language (UML).

In various embodiments, the graphical representation of the simulation executable code may be displayed on a display of the computing device. The graphical representation may include a graphics associated with an architectural representation of the simulation. For example, the architectural representation of the simulation may include one or more icons associated with each agent requested to be included in the simulation. Each icon may correspond to one characteristic of an agent and the icon may include information associated with attributes of the agent, operations of the agent, and behavior of the agent.

In some embodiments, the graphical representation may be configured to receive inputs indicating a request to modify the simulation. For example, the behavior information may include state information and the graphical representation may be configured to receive an input to modify the current state information. In response to receiving a request to modify information included in the graphical representation of the simulation, the processor may update the simulation executable code to reflect the modification to the current state information and generate an updated graphical representation of the simulation executable code. The updated graphical representation of the simulation executable code may be displayed.

In other embodiments, the graphical representation may include the rendered images corresponding to the simulation. For example, the processor may orchestrate, analyze, and execute the executable code to create image frames to display the simulation.

Figure 12:
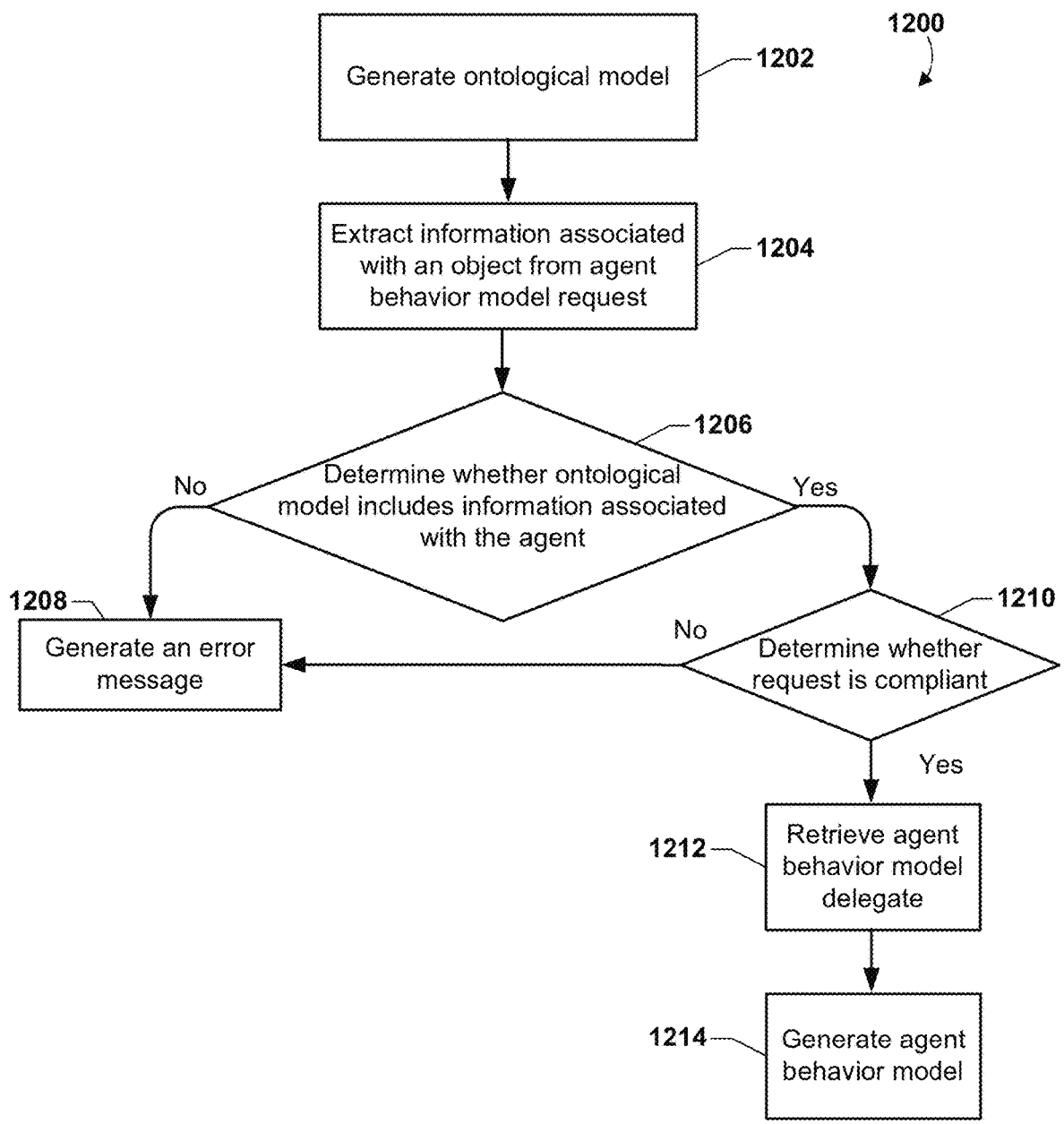
FIG. 12 is a process flow diagram illustrating an embodiment method for generating an agent behavior model.

FIG. 12 illustrates an embodiment method 1200 for generating an agent behavior model. In an embodiment, the operations of method 1200 may be performed by one or more processors of a computing device (e.g., processor 1002 and/or processors of servers 1052, 1054, 1056). In some embodiments, the method 1200 may be performed in a Unifying Framework for Orchestration and Simulation (UFOS) environment.

In block 1202, the processor may generate an ontological model. The ontological model may include information associated with concepts, activities, and/or objects corresponding to one or more agents and/or the environment/domain as well as relational information including information associated with relationships, constraints, rules, and operations for a particular environment/domain.

This information may be classified within the ontological model in two different ways. First, the information may be classified using formal naming and definitions of the types, properties, and/or interrelationships of the objects. In addition, the information associated with the types and/or properties may be abstracted to generic terms to create abstract object classes. For example, if an ontological model used "aircraft" and "sun" as formal nomenclature, the ontological model may further include the abstracted types of objects such as "thing" or "light source", respectively.

After the types and/or properties associated with an object are abstracted, then relational information for the abstracted information is automatically generated based on the relationships between the formal nomenclature and the abstracted types and/or properties. For example, the hierarchical, dimensional, dependent arrangement, relationships and interactions between the abstract types and/or properties associated with an object may be created. In some embodiments, as simulations are executed, analyzed, and/or generated the ontological model may be updated to reflect the results of each simulation.

In block 1204, the processor may extract information associated with an object included in the agent behavior model request. In some embodiments, the agent behavior model request may include object information and an operation statement. The processor may extract the object information from the agent behavior model request.

In decision block 1206, the processor may determine whether the ontological model includes information associated with the agent based on the extracted information associated with the object. For example, the processor may compare the extracted information associated with the object with the classes of the ontological model.

If the extracted information associated with the object is not found in the formal nomenclature of the ontological model, in some embodiments, the processor may be configured to interpret the extracted information using an expression language interpreter. The interpreted information may result in an abstraction such that the processor may determine whether the abstract nomenclature corresponds to an abstract class included in the ontological model. The processor may further be configured to convert the interpreted information associated with the object into an expression using UML.

In response to determining that the ontological model does not include information associated with the agent (i.e. determination block 1206="No"), the processor may generate an error message in block 1208 to indicate that a simulation in response to the simulation query may not be generated.

In response to determining that the ontological model does include information associated with the agent (i.e. determination block 1206="YES"), the processor may determine whether the agent behavior model request is compliant in decision block 1210. In an exemplary embodiment, the processor may determine whether an operational statement is proper with respect to the objects called within the operational statement.

In response to determining that the operational statement is not proper (i.e., determination block 1210="No"), the processor generates an error message in block 1208 to indicate that a simulation in response to the simulation query may not be generated.

In response to determining that the operational statement is proper (i.e., determination block 1210="Yes"), the processor may retrieve an agent behavior model delegate in block 1212. In some embodiments, the agent behavior model delegate may be a pre-coded meta-model that may generically describe one or more agent behavior characteristics. The agent behavioral model delegate may include a behavior placeholder and an object place holder.

In block 1214, the processor may generate the agent behavior model by updating the agent behavior model delegate to include information associated with the object from the ontological model. For example, the processor may update the agent behavioral model delegate such that the behavior placeholder is replaced with corresponding information from the ontological model. After the agent behavioral model delegate is updated to include ontological model information, the processor may generate the agent behavioral model using source code that include the object place holder.

The foregoing method descriptions and the process flow diagrams are provided merely as illustrative examples and are not intended to require or imply that the steps of the various embodiments must be performed in the order presented. As will be appreciated by one of skill in the art the order of steps in the foregoing embodiments may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The hardware used to implement the various illustrative logics, logical blocks, modules, and circuits described in connection with the aspects disclosed herein may be implemented or performed with a general purpose processor, a digital signal processor (DSP), a graphics processing unit (GPU), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

In one or more exemplary aspects, the functions described may be implemented in hardware, software, firmware, or any combination thereof. If implemented in software, the functions may be stored as one or more instructions or code on a non-transitory computer-readable medium or non-transitory processor-readable medium. The steps of a method or algorithm disclosed herein may be embodied in a processor-executable software module which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable medium and/or computer-readable medium, which may be incorporated into a computer program product.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

What is claimed is:

1. A method, comprising:
   receiving, by a processor of a computing device, a simulation query including an agent identifier associated with an agent to be included in a simulation;
   determining, by the processor, whether the simulation query includes an operation statement;
   requesting, by the processor, an agent behavior model based on the agent identifier in response to determining that the simulation query includes an operation statement;
   receiving, by the processor, the requested agent behavior model from a Unifying Framework for Orchestration and Simulation (UFOS) environment, wherein the requested agent behavior model includes an agent information placeholder;
   retrieving, by the processor, an agent model of the agent to be included in the simulation;
   updating, by the processor, the agent behavior model to replace the agent information placeholder with information included in the agent model;
   compiling, by the processor, the agent behavior model and the agent model to generate simulation executable code;
   generating, by the processor, a graphical representation of the simulation executable code to display on a display of the computing device;
   determining, by the processor, whether the simulation query includes a conditional statement;
   executing, by the processor, the simulation executable code to identify discrete times of the simulation in which the conditional statement is met;
   rendering, by the processor, portions of the simulation that correspond to the identified discrete times in which the conditional statement is met; and
   displaying, on the display of the computing device, the portions of the simulation that correspond to the identified discrete times in which the conditional statement is met,
   wherein portions of the simulation that correspond to discrete times in which the conditional statement is not met are omitted from the simulation of the portions of the simulation that correspond to the identified discrete times in which the conditional statement is met that is displayed.

2. The method of claim 1, further comprising:
   generating, by the UFOS environment, an ontological model corresponding to the agent to be included in the simulation, wherein the ontological model includes an object class and an abstract object class associated with the object class;
   extracting, by the UFOS environment, information associated with an object included in the agent behavior model request in response to receiving the agent behavior model request;
   determining, by the UFOS environment, whether the ontological model includes information associated with the agent based on the extracted information associated with the object;
   determining, by the UFOS environment, whether the agent behavior model request is compliant based on information associated with at least one of the object class and the abstract object class of the ontological model in response to determining that the ontological model includes information associated with the agent;
   retrieving, by the UFOS environment, an agent behavior model delegate in response to determining that the agent behavior model request is compliant; and
   generating, by the UFOS environment, the agent behavior model by updating the agent behavior model delegate to include information associated with the object from the ontological model.

3. The method of claim 2, further comprising:
   interpreting, by an expression language interpreter of the UFOS environment, the extracted information associated with the object; and
   converting, by the expression language interpreter of the UFOS environment, the interpreted information associated with the object into an expression using Unified Modeling Language (UML),
wherein determining whether the ontological model includes information associated with the agent using the UML expression.

4. The method of claim 1, further comprising:
displaying, on the display of the computing device, the graphical representation of the simulation executable code,
wherein the graphical representation of the simulation executable code includes an architectural representation of the simulation.

5. The method of claim 4, wherein:
the architectural representation of the simulation includes an icon associated with the agent, and
the icon associated with the agent includes information associated with attributes of the agent, operations of the agent, and behavior of the agent.

6. The method of claim 5, further comprising:
receiving, by the processor, a request to modify the information associated with the behavior of the agent;
updating, by the processor, the simulation executable code based on the request to modify the information associated with the behavior of the agent; and
generating, by the processor, an updated graphical representation of the simulation executable code to display on the display of the computing device.

7. A computing device, comprising:
an input device;
a display;
a Unifying Framework for Orchestration and Simulation (UFOS) environment;
a memory; and
a processor coupled to the input device, the display, the UFOS environment, and the memory, wherein the processor is configured with processor-executable instructions to perform operations comprising:
receiving, via the input device, a simulation query including an agent identifier associated with an agent to be included in a simulation;
determining whether the simulation query includes an operation statement;
requesting, from the UFOS environment, an agent behavior model based on the agent identifier in response to determining that the simulation query includes an operation statement;
receiving, from the UFOS environment, the requested agent behavior model, wherein the requested agent behavior model includes an agent information placeholder;
retrieving, from the memory, an agent model of the agent to be included in the simulation;
updating the agent behavior model to replace the agent information placeholder with information included in the agent model;
compiling the agent behavior model and the agent model to generate simulation executable code;
generating a graphical representation of the simulation executable code to display on a display of the computing device within a graphical user interface;
determining whether the simulation query includes a conditional statement;
executing the simulation executable code to identify discrete times of the simulation in which the conditional statement is met;

rendering portions of the simulation that correspond to the identified discrete times in which the conditional statement is met; and
displaying, on the display, the portions of the simulation that correspond to the identified discrete times in which the conditional statement is met,
wherein portions of the simulation that correspond to discrete times in which the conditional statement is not met are omitted from the simulation of the portions of the simulation that correspond to the identified discrete times in which the conditional statement is met that is displayed.

8. The computing device of claim 7, wherein the UFOS environment comprises a processor configured with processor-executable instructions to perform operations comprising:
generating an ontological model corresponding to the agent to be included in the simulation, wherein the ontological model includes an object class and an abstract object class associated with the object class;
extracting information associated with an object included in the agent behavior model request in response to receiving the agent behavior model request;
determining whether the ontological model includes information associated with the agent based on the extracted information associated with the object;
determining whether the agent behavior model request is compliant based on information associated with at least one of the object class and the abstract object class of the ontological model in response to determining that the ontological model includes information associated with the agent;
retrieving an agent behavior model delegate in response to determining that the agent behavior model request is compliant; and
generating the agent behavior model by updating the agent behavior model delegate to include information associated with the object from the ontological model.

9. The computing device of claim 8, wherein the processor of the UFOS environment is configured with processor-executable instructions to perform further operations comprising:
interpreting, via an expression language interpreter of the UFOS environment, the extracted information associated with the object; and
converting, via the expression language interpreter of the UFOS environment, the interpreted information associated with the object into an expression using Unified Modeling Language (UML);
wherein determining whether the ontological model includes information associated with the agent using the UML expression.

10. The computing device of claim 7, wherein the processor of the computing device is configured with processor-executable instructions to perform further operations comprising:
displaying, on the display, the graphical representation of the simulation executable code,
wherein the graphical representation of the simulation executable code includes an architectural representation of the simulation.

11. The computing device of claim 10, wherein:
the architectural representation of the simulation includes an icon associated with the agent; and
the icon associated with the agent includes information associated with attributes of the agent, operations of the agent, and behavior of the agent.

12. The computing device of claim 11, wherein the processor of the computing device is configured with processor-executable instructions to perform further operations comprising:
- receiving, via the input device, a request to modify the information associated with the behavior of the agent;
- updating the simulation executable code based on the request to modify the information associated with the behavior of the agent; and
- generating an updated graphical representation of the simulation executable code to display on the display of the computing device.

13. A non-transitory processor readable medium having stored thereon processor executable instructions configured to cause one or more processors of a computing device to perform operations comprising:
- receiving a simulation query including an agent identifier associated with an agent to be included in a simulation;
- determining whether the simulation query includes an operation statement;
- requesting an agent behavior model based on the agent identifier in response to determining that the simulation query includes an operation statement;
- receiving the requested agent behavior model from a Unifying Framework for Orchestration and Simulation (UFOS) environment, wherein the requested agent behavior model includes an agent information placeholder;
- retrieving an agent model of the agent to be included in the simulation;
- updating the agent behavior model to replace the agent information placeholder with information included in the agent model;
- compiling the agent behavior model and the agent model to generate simulation executable code;
- generating a graphical representation of the simulation executable code to display on a display;
- determining whether the simulation query includes a conditional statement;
- executing the simulation executable code to identify discrete times of the simulation in which the conditional statement is met;
- rendering portions of the simulation that correspond to the identified discrete times in which the conditional statement is met; and
- displaying the portions of the simulation that correspond to the identified discrete times in which the conditional statement is met,
- wherein portions of the simulation that correspond to discrete times in which the conditional statement is not met are omitted from the simulation of the portions of the simulation that correspond to the identified discrete times in which the conditional statement is met that is displayed.

14. The non-transitory processor readable medium of claim 13, wherein the stored processor executable instructions are configured to cause the one or more processors of the computing device to perform operations further comprising:
- generating an ontological model corresponding to the agent to be included in the simulation, wherein the ontological model includes an object class and an abstract object class associated with the object class;
- extracting information associated with an object included in the agent behavior model request in response to receiving the agent behavior model request;
- determining whether the ontological model includes information associated with the agent based on the extracted information associated with the object;
- determining whether the agent behavior model request is compliant based on information associated with at least one of the object class and the abstract object class of the ontological model in response to determining that the ontological model includes information associated with the agent;
- retrieving an agent behavior model delegate in response to determining that the agent behavior model request is compliant; and
- generating the agent behavior model by updating the agent behavior model delegate to include information associated with the object from the ontological model.

15. The non-transitory processor readable medium of claim 14, wherein the stored processor executable instructions are configured to cause the one or more processors of the computing device to perform operations further comprising:
- interpreting, via an expression language interpreter, the extracted information associated with the object; and
- converting, via the expression language interpreter, the interpreted information associated with the object into an expression using Unified Modeling Language (UML);
- wherein determining whether the ontological model includes information associated with the agent using the UML expression.

16. The non-transitory processor readable medium of claim 13, wherein the stored processor executable instructions are configured to cause the one or more processors of the computing device to perform operations further comprising:
- displaying, on the display, the graphical representation of the simulation executable code, wherein:
  - the graphical representation of the simulation executable code includes an architectural representation of the simulation;
  - the architectural representation of the simulation includes an icon associated with the agent, and
  - the icon associated with the agent includes information associated with attributes of the agent, operations of the agent, and behavior of the agent.

17. The non-transitory processor readable medium of claim 16, wherein the stored processor executable instructions are configured to cause the one or more processors of the computing device to perform operations further comprising:
- receiving a request to modify the information associated with the behavior of the agent;
- updating the simulation executable code based on the request to modify the information associated with the behavior of the agent; and
- generating an updated graphical representation of the simulation executable code to display on the display.

* * * * *